(12) United States Patent
Yang et al.

(10) Patent No.: US 11,727,178 B2
(45) Date of Patent: Aug. 15, 2023

(54) UNDER TEST PIN LOCATION DRIVEN SIMULTANEOUS SIGNAL GROUPING AND PIN ASSIGNMENT

(71) Applicant: Synopsys, Inc., Mountain View, CA (US)

(72) Inventors: Yu Yang, Shanghai (CN); Jianfeng Huang, Shanghai (CN); Shih-Ying Liu, Hsinchu (TW)

(73) Assignee: Synopsys, Inc., Sunnyvale, CA (US)

( * ) Notice: Subject to any disclaimer, the term of this patent is extended or adjusted under 35 U.S.C. 154(b) by 24 days.

(21) Appl. No.: 17/488,908

(22) Filed: Sep. 29, 2021

(65) Prior Publication Data

US 2022/0100942 A1   Mar. 31, 2022

Related U.S. Application Data

(60) Provisional application No. 63/084,801, filed on Sep. 29, 2020.

(51) Int. Cl.
*G06F 30/347* (2020.01)

(52) U.S. Cl.
CPC ................. *G06F 30/347* (2020.01)

(58) Field of Classification Search
CPC .................................... G06F 30/347
USPC ........................................ 716/117
See application file for complete search history.

(56) References Cited

U.S. PATENT DOCUMENTS

| | | | |
|---|---|---|---|
| 2008/0168206 A1* | 7/2008 | Bellows | G06F 13/4059 710/305 |
| 2010/0176846 A1* | 7/2010 | Kojima | G01R 31/2889 327/77 |
| 2017/0293708 A1* | 10/2017 | Geist | G06F 30/3323 |

OTHER PUBLICATIONS

Hua Xiang, et al., "Min-Cost Flow-Based Algorithm for Simultaneous Pin Assignment and Routing", IEEE Transactions on Computer-Aided Design of Integrated Circuits and Systems, vol. 22, No. 7, Jul. 2003, 9 pages.

* cited by examiner

*Primary Examiner* — Suchin Parihar
(74) *Attorney, Agent, or Firm* — Lowenstein Sandler LLP

(57) ABSTRACT

A method includes generating a channel configuration between a first signal pin of a first integrated circuit (IC) die and a second signal pin of a second IC die based on a multiplex data rate (XDR) of the first signal pin and the second signal pin. The channel configuration includes an association of the XDR to a channel. The method also includes determining a signal pin channel assignment based on the channel configuration, updating the channel configuration based on the signal pin channel assignment and a wirelength representative of a total distance between the first signal pin, the second signal pin, and physical ports of the channel, and performing socket instantiation based on the updated channel configuration and the signal pin channel assignment.

20 Claims, 22 Drawing Sheets

UNDER TEST PIN LOCATION DRIVEN SIMULTANEOUS SIGNAL GROUPING AND PIN ASSIGNMENT

CROSS-REFERENCE TO RELATED APPLICATIONS

The present application claims the benefit under 35 U.S.C. § 119(e) of U.S. Provisional Patent Application No. 63/084,801 filed on Sep. 29, 2020, which is incorporated herein by reference in its entirety for all purposes.

TECHNICAL FIELD

The present disclosure relates generally to a design under test. In particular, the present disclosure relates to a design under test pin location driven simultaneous signal grouping and pin assignment.

BACKGROUND

Traditional software simulation cannot keep pace with the more and more sophisticated integrated circuits (IC) products. Hardware based emulation system can overcome the inefficiency and lack of scalability problem suffered in software based simulation approach. One popular approach to construct hardware based emulation is a Multiple FPGA System (MFS). A MFS includes multiple field programmable gate arrays (FPGAs) with pre-defined interconnections between each pair of FPGAs. A design may be partitioned and mapped on to each individual FPGA. One key to a successful and high performance compilation is to correctly handle the interconnections between FPGA boundaries to meet the timing while ensuring compilation success without routing congestion.

SUMMARY

In one aspect, a method includes generating a channel configuration between a first signal pin of a first integrated circuit (IC) module and a second signal pin of a second IC die based on a multiplex data rate (XDR) of the first signal pin and the second signal pin. The channel configuration includes an association of the XDR to a channel. The method also includes determining a signal pin channel assignment based on the channel configuration, updating the channel configuration based on the signal pin channel assignment and a wirelength representative of a total distance between the first signal pin, the second signal pin, and physical ports of the channel, and performing socket instantiation based on the updated channel configuration and the signal pin channel assignment.

In one aspect, a system a memory storing instructions; and a processor, coupled with the memory and to execute the instructions, the instructions when executed cause the processor to generate a channel configuration between a first signal pin of a first IC die and a second signal pin of a second IC die based on a multiplex data rate (XDR) of the first signal pin and the second signal pin. The channel configuration includes an association of the XDR to a channel. The processor further determine a signal pin channel assignment based on the channel configuration, update the channel configuration based on the signal pin channel assignment and a wirelength representative of a total distance between the first signal pin, the second signal pin, and physical ports of the channel, and perform socket instantiation based on the updated channel configuration and the signal pin channel assignment.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
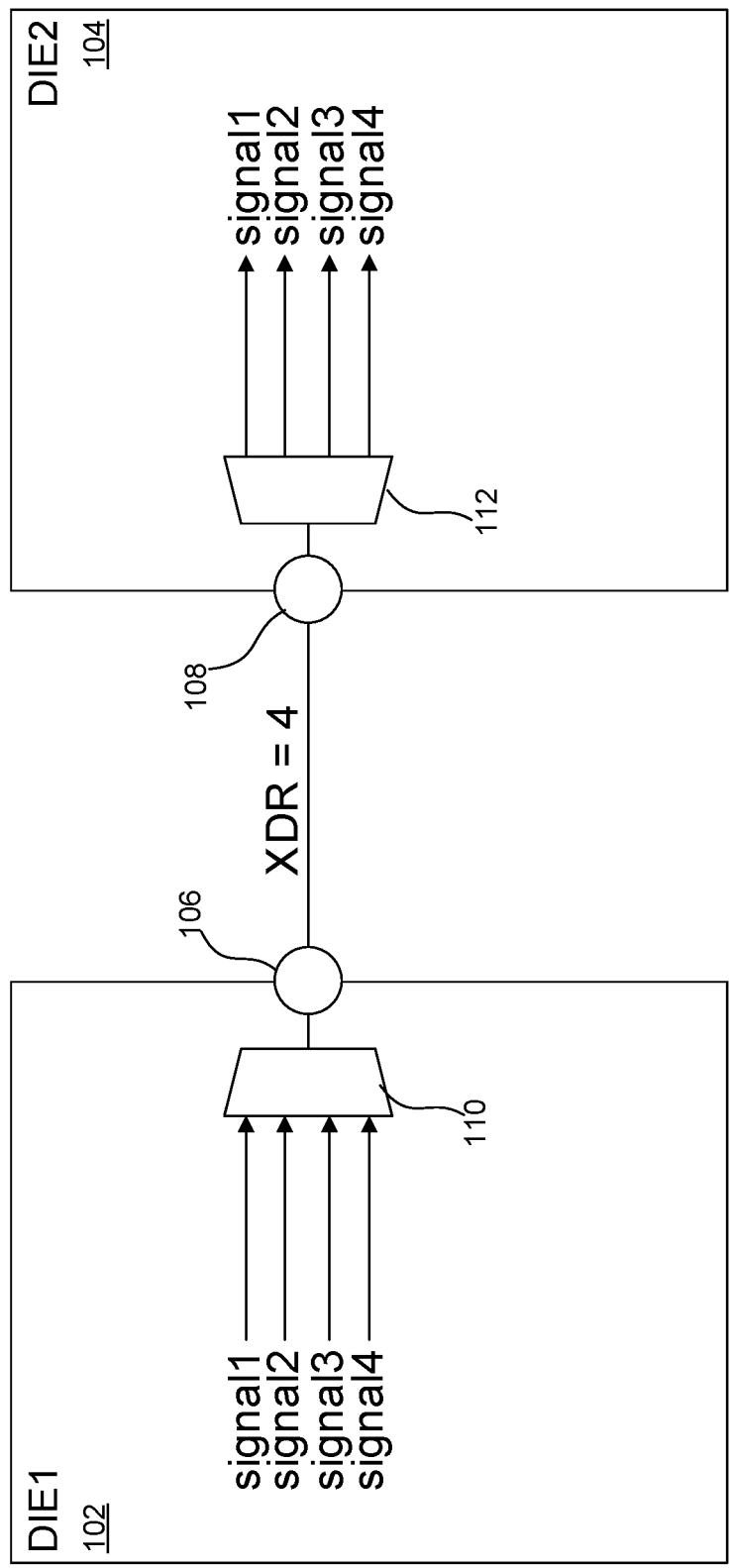
FIG. 1 illustrates a block diagram of a pair of FPGAs, in accordance with an embodiment of the present disclosure.

Aspects of the present disclosure relate to design under test (DUT) pin location driven simultaneous signal grouping and pin assignment.

Signal communication between a pair of field programmable gate arrays (FPGAs) is transmitted through a physical device called a socket. Pin assignment refers to assigning specific design wires to specific sockets. The number of sockets between a pair of FPGAs is limited, which in turn limits the number of signals that can be transmitted between the pair of FPGAs. To overcome this limitation, a technique called multiple timing division multiplex (MTDMX) can be used so that multiple signals share a physical wire. In an exemplary configuration, multiplexers are deployed in a sender-side FPGA and de-multiplexers are deployed in a receiver-side FPGA where signals are sent sequentially at a sender side and received sequentially at a receiver side. In addition, different signals are assigned to different MTDMX rates referred to as multiplex data rate (XDR).

In some embodiments, signal grouping may be followed by socket assignment. However, by performing simultaneously, signal grouping and socket assignment the wirelength is minimized.

Described herein is a wirelength driven socket generation algorithm that simultaneously determines signal grouping and socket (channel) assignments. A coarse analytical placement is performed to estimate a physical location of logic (e.g., signal pins). After the physical location of logic is obtained, a location of sockets and signals that needs to share the same physical wire is determined through a network flow approach with minimal increase to wirelength. Wirelength represents the sum of distances between a logic signal port and a physical port. The distance is determined by assigning the logic signal port (physical coordinate is determined by a placement engine) to a specific physical port (which is pre-determined). In one example, Manhattan distance metrics may be used.

The approach described herein determines the signal's assignment (i.e., which channel the signal will connect to) and determines a channel configuration. The channel configuration refers to whether or not a channel is used and the XDR value associated with the channel. The signal pin can only connect to a channel with the same XDR. The signal XDR value is determined based on the timing criticality for signal and the total available channel count. A placement engine e.g. analytical placement engine can be implemented to determine respective positions of the signal pins. The position of the signal pins may be fixed during the channel configuration and the pin-channel assignment. For each signal pin, an XDR value is determined. All signals going through a channel have the same XDR value.

In some embodiments, the signal pin channel assignment may be determined using an optimization technique (e.g., min-cost max flow technique). The min-cost max flow technique minimizes the cost of flow through a flow network. For example, a network graph representative of the signal pins and the channels between two FPGAs may be created. Then, a numerical technique (e.g., Edmonds and Karp, Ford-Fulkerson) may be used to solve the min cost max flow using the network graph. The numerical technique minimizes the total cost of flow over all edges of the network graph by finding an augmenting path using breadth first search (BFS).

In some embodiments, the channel configuration is updated after the signal pin assignment. The channel configuration may be updated based on the wirelength for the signal pin channel assignment. The signal pin channel assignment and the channel configuration may be repeated until a predetermined iteration termination condition is satisfied.

Advantages of the present disclosure include, but are not limited to, meeting timing requirement for handling interconnections between die boundary while ensuring compilation success without routing congestion and providing optimized wirelength between the die by performing simultaneous signal grouping and pin assignment.

FIG. 1 illustrates a block diagram of a pair of FPGAs (i.e., module, FPGA die), in accordance with an embodiment of the present disclosure. A first FPGA 102 includes a first physical port 106. A second FPGA 104 includes a second physical port 106. In FIG. 1, the XDR is equal to four, by way of non-limiting example. The XDR represents the number of logic signals that may share the same physical connection. An XDR for a signal is used to represent that the signal is to be connected to a physical port that has the same XDR. For example, if signal 1, signal 2, signal 3, and signal 4 have an XDR equal to four, then the four signals can be grouped together and share the same physical port (e.g., the first physical port 106). The first FPGA 102 may represent the transmitter side. The second FPGA 104 may represent the receiver side. As shown in FIG. 1, four signals (signal 1, signal 2, signal 3, signal 4) are multiplexed using multiplexer 110. Then, the signals are demultiplexed using demultiplexer 112 in the second FPGA 104.

Figure 2:
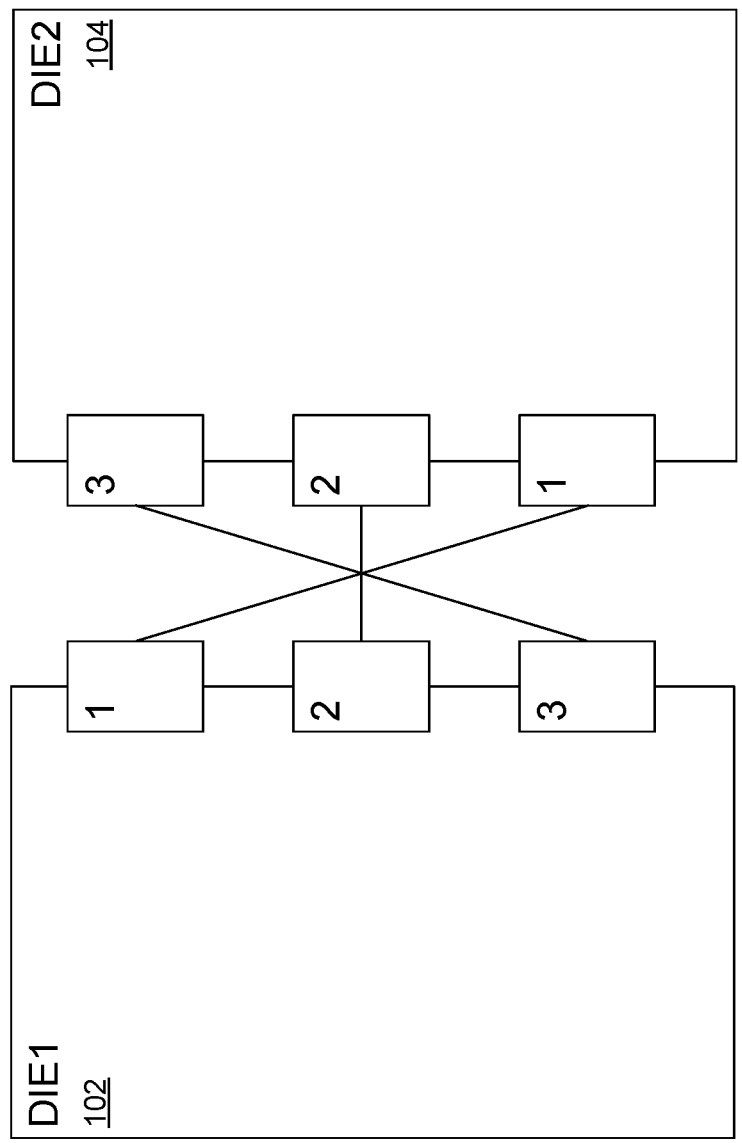
FIG. 2 illustrates channels between the pair of FPGAs, in accordance with an embodiment of the present disclosure.

FIG. 2 is a schematic that illustrates channels between a pair of FPGAs in accordance with one embodiment of the present disclosure. Three channels: channel 1, channel 2, and channel 3 may connect the first FPGA 102 and the second FPGA 104. Each channel contains a fixed number of physical ports (e.g., 80 ports). All physical ports associated with a channel have the same XDR due to hardware constraints. In some embodiments, the positions of signal pins may be determined by a placement engine e.g. analytical placement engine. The analytical placement engine is so termed because it models wirelength as a convex function (e.g. quadratic wirelength model). The quadratic wirelength is a function of the coordinates of the signal pins and the connection between the signal pins. Each channel (e.g., channel 1, channel 2, and channel 3) is configured with an XDR value. The channel allows signals having the same XDR value to pass. Thus, all signals going through a channel have the same XDR value. For example, for a channel having 80 ports and an XDR equal to 4, all 320 signals passing through the channel have the same data rate.

Figure 3A:
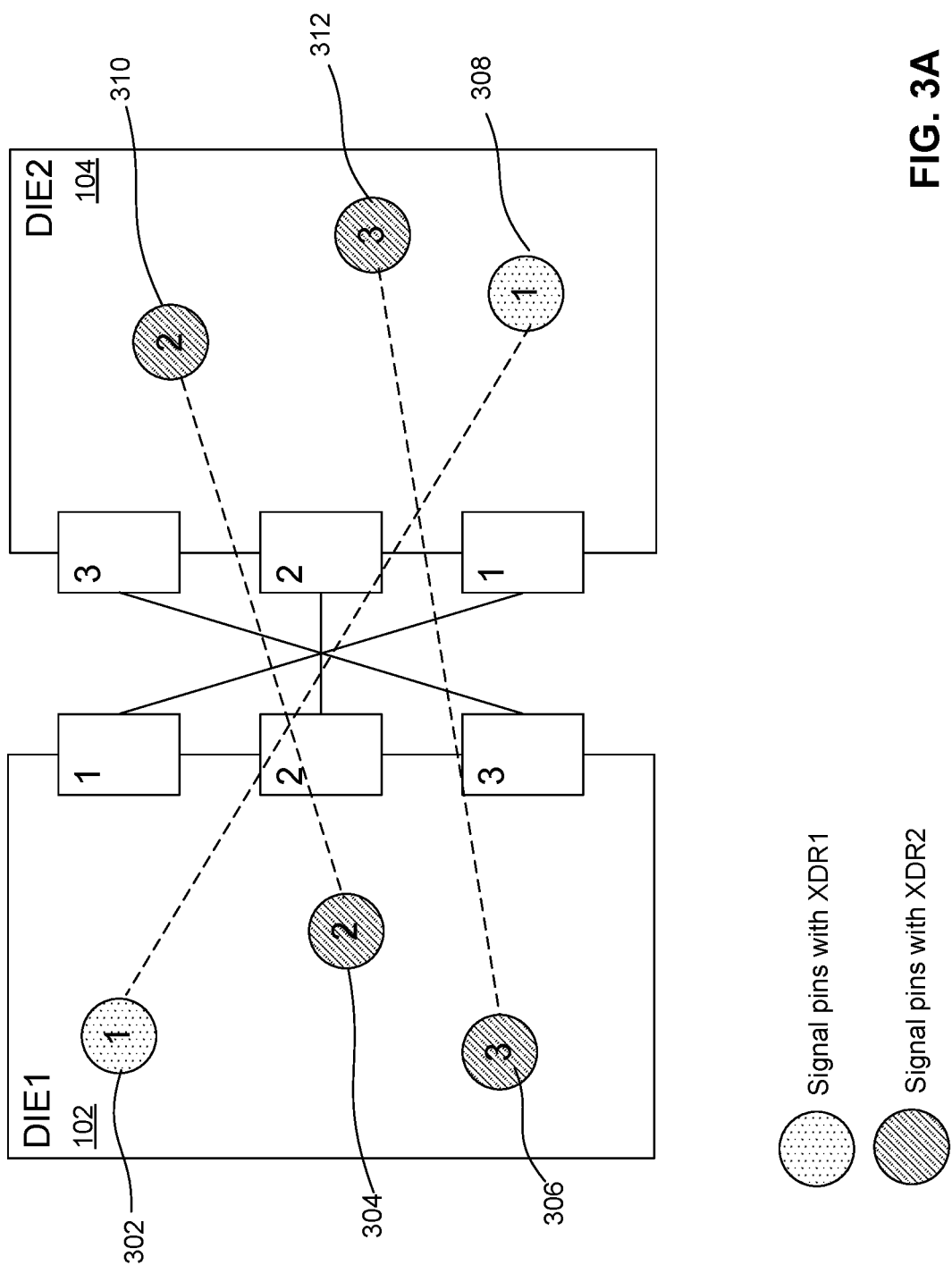
FIG. 3A illustrates a pair of FPGAs before pin assignment, in accordance with an embodiment of the present disclosure.
Figure 3B:
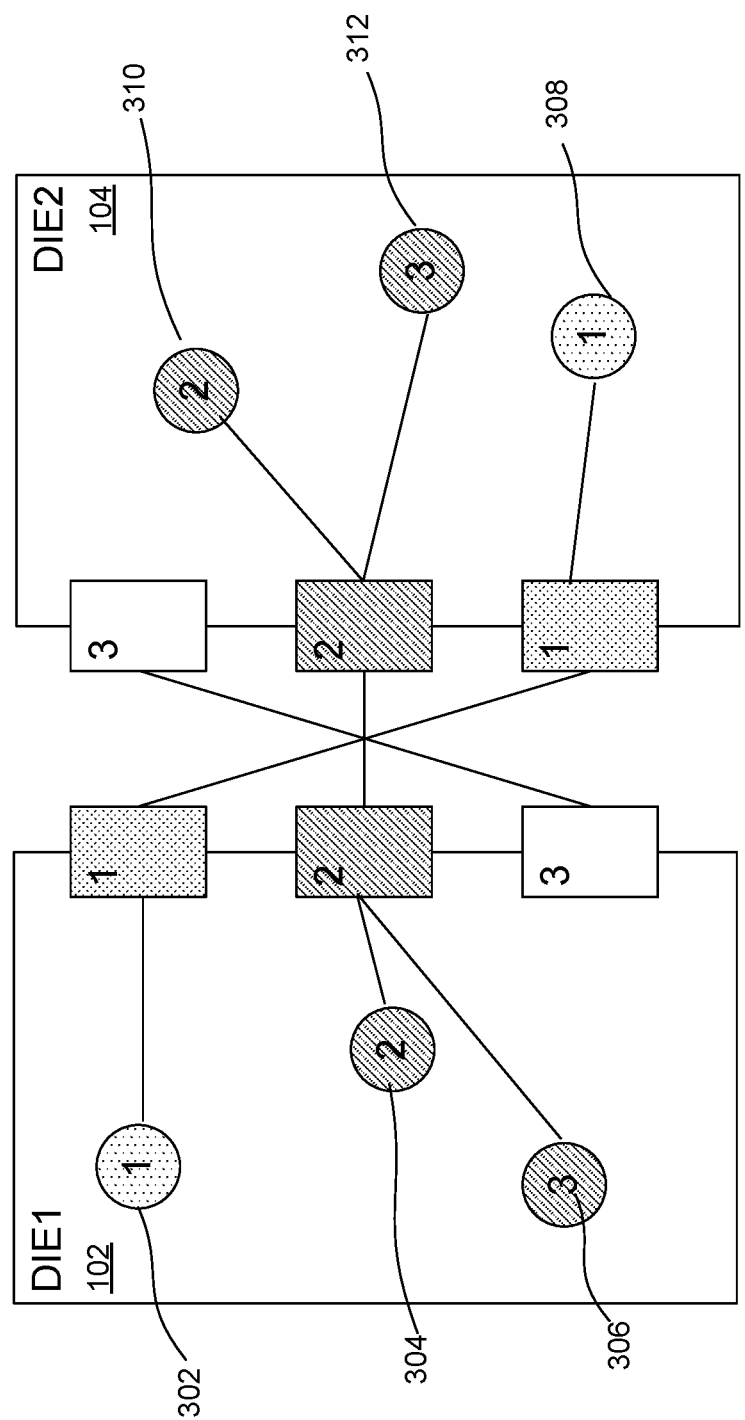
FIG. 3B illustrates a pair of FPGAs after pin assignment, in accordance with an embodiment of the present disclosure.

FIG. 3A and FIG. 3B illustrate the pair of FPGAs (first FPGA 102 and second FPGA 104) before and after pin assignment, in accordance with an embodiment of the present disclosure. The first FPGA 102 may include a first signal pin 302, a second signal pin 304, and a third signal pin 306. The second FPGA 104 may include a fourth signal pin 308, a fifth signal pin 310, and a sixth signal pin 312. In FIG. 3A, the first signal pin 302 (transmitter side) has an XDR equals to XDR1. The dashed lines represent that the signal pins of the transmitter side and the signal pins on the receiver side are to be connected together through a channel. For example, the first signal pin 302 is to be connected with the fourth signal pin 304 (receiver side) with XDR1 through a channel. The second signal pin 304 and the third signal pin 306 have an XDR equals to XDR2. In the receiver side (i.e., FPGA 104), the fifth signal pin 310 and the sixth signal pin 312 have an XDR equals to XDR2. The second signal pin 304 is to be connected with the fifth signal pin 310 and the third signal pin 306 is to be connected with the sixth signal pin 312. In some embodiments, the first signal pin 302 has (x,y) as coordinate.

In FIG. 3B, the first channel is assigned to an XDR1 and the second channel is assigned to an XDR2. The signal pin 302 connects to signal pin 304 through channel 1. Signal pins 306 and 308 with XDR2 connect to signal pins 310 and 312 via channel 2. The third channel is unassigned. The solid lines represent the connection of the signal pins to the channel after signal pin channel assignment. The signal pin channel assignment and the channel configuration shown in FIG. 3B may be obtained using the approaches described herein.

In some embodiments, the algorithm objective is to find the best signal assignment and channel configuration so the total distance (i.e., summation of distance) for each signal to the channel (e.g., left die distance+right die distance) is minimal. The left die distance may refer to the distance from a signal pin to the channel in the transmitter side. The right die distance may refer to the distance from the channel to the signal pin in the receiver side. In one implementation, the process described herein minimizes the summation of distance (e.g., Manhattan distance of left die distance and right die distance) of each pair of signal pins.

Figure 4:
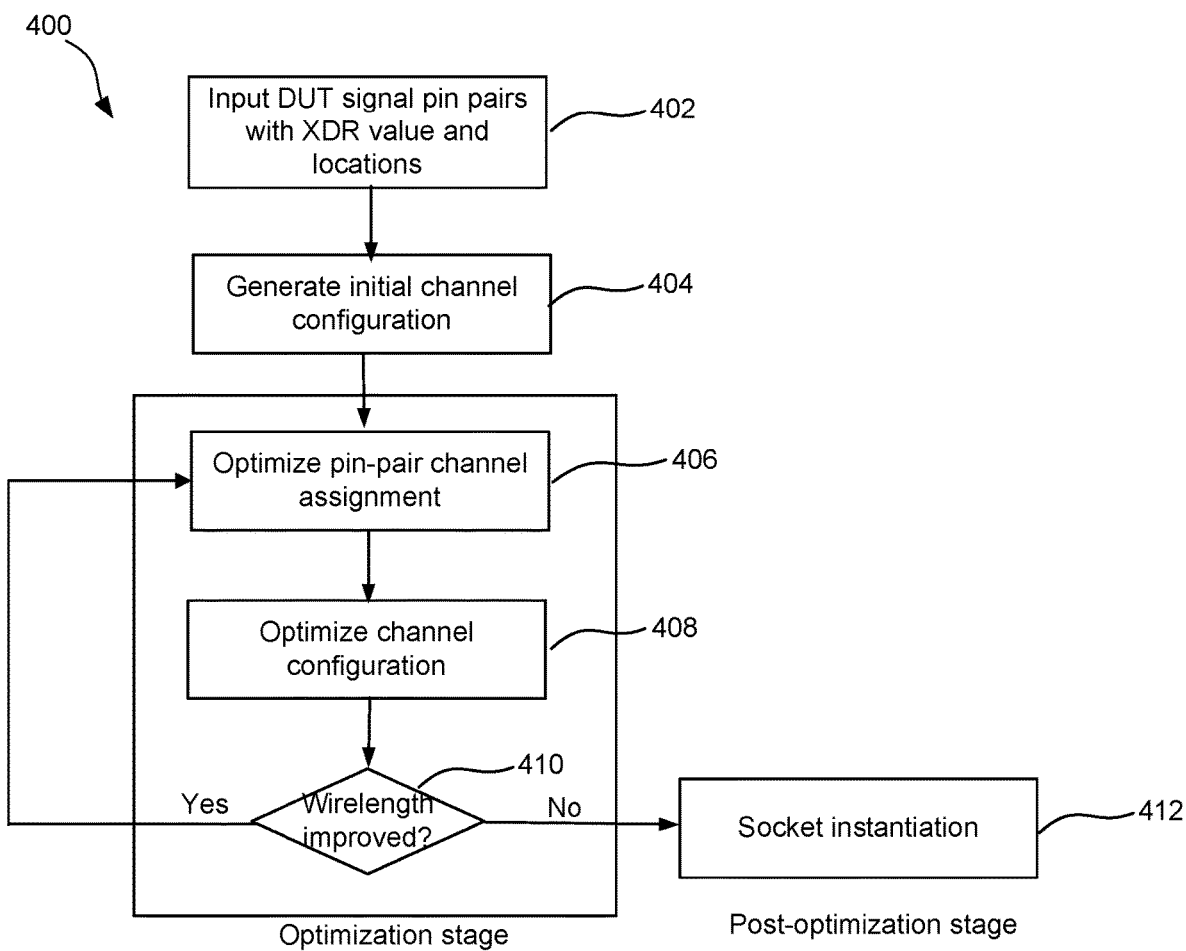
FIG. 4 illustrates a flowchart for a process for pin and channel assignment, in accordance with an embodiment of the present disclosure.

FIG. 4 illustrates a flowchart for a process 400 for pin and channel assignment, in accordance with an embodiment of the present disclosure. In 402, DUT data may be acquired. The DUT data may include the locations of the signal pins and the XDR associated with the signal pins. The DUT signal pin pairs are inputted with XDR values and locations associated with the DUT signal pin pairs. In some embodiments, the position of each signal pin is fixed during the pin and channel assignment process. In addition, the XDR value associated with each signal may be predetermined based on the timing criticality of the signal and the total available channel count.

In 404, a channel configuration (i.e., initial channel configuration) is determined. As described previously herein, the channel configuration refers to whether or not a channel is used and the XDR value associated with the channel. The total number of signals for each XDR is determined based on the signal number and the XDR value for each signal. In some embodiments, the XDR value for each signal are determined by the placement engine. Since each channel can only accommodate a fixed number of signals for a particular XDR, the number of channels required for each XDR can be determined. Then, each channel is configured based on the required number of channels among all available channels. Channels can be configured consecutively (one by one) starting from the channel with the highest XDR to the channel with the lowest XDR. Note that some channels may be unused because there may be less signals between the FPGA pair. In some embodiments, the channels are configured based on the associated name of the signals (e.g., by alphabetical order). In some embodiments, other sorting or random order may be used. For example, the first signal (i.e., sorted by alphabetical order) may be assigned to a first channel.

In one aspect, the algorithm is carried out using an iterative technique. In each iteration, two steps are implemented alternatively (406 and 408).

In 406, signal-channel assignments are identified using a min-cost max-flow algorithm. Signal pins' coordinates and channel configuration are previously identified during 402 and in 404. Different XDR values are processed independently. The min-cost max-flow algorithm is further described in relation to FIGS. 5-13. For example, a graph representative of the signal pins of the modules may be created. Then, a numerical technique (e.g., Edmonds and Karp) may be used to solve the min cost max flow using the graph. The signal pin is assigned to a channel when there is a flow in the graph between the signal pin and the channel.

In 408, the channels are reconfigured based on the signal pin channel assignment and the wirelength. The wirelength may be equal to the total distance between the signal pins and the physical ports of the respective channel in the transmitter side and the receiver side (i.e., FPGA 102 and FPGA 104). In some embodiments, the channels are adjusted to minimize the wirelength.

In 410, a determination is made whether the wirelength has improved (i.e., the wirelength is reduced as compared to a previous iteration). In response to determining that the wirelength has not improved, the process proceeds to step 412. In response to determining that the wirelength has improved, the process goes back to step 406. Steps 406 and 408 are repeated until a predetermined iteration termination condition is satisfied. For example, the cost cannot be reduced further. In some aspects, the iteration termination condition is satisfied when a threshold wirelength condition is satisfied. In some aspects, the threshold wirelength condition can be when the cost (i.e., wirelength) reduction is less than a predetermined value (e.g., percentage decrease). Process 400 may be repeated for all FPGA pairs in the emulator hardware. In some embodiments, the iteration termination condition is satisfied when the compile time exceeds a threshold.

In the post optimization stage, the sockets are instantiated using a firmware library at 412 which defines the capacity on number of signals it can be connected and the direction of the signal. The connections from each signal pin to the physical port of the corresponding channel (socket) are made based on the channel configuration.

It should be understood that some of the above steps of the flow diagram of FIG. 4 can be executed or performed in an order or sequence other than the order shown and described in the figure. Further, some of the above steps may be performed well in advance of other steps, or may be executed or performed substantially simultaneously or in parallel.

FIGS. 5-13 illustrate steps for process 400 for pin and channel assignment, in accordance with an embodiment of the present disclosure. In the illustrative example, all signal pins are assumed to have the same XDR. A first FPGA 502 includes signal pins 506, 508, 510, 512. A second FPGA 504 includes signal pins 514, 516, 518, 520. The two FPGAs are connected via a first channel 522, a second channel 524, and a third channel 526. After initial channel configuration (e.g., at 404 of FIG. 4), the first channel 522 and the second channel 524 are assigned an XDR value equals to the XDR of the signal pins. The third channel 526 is not assigned an XDR and is not being used to connect the signal pins.

Figure 5:
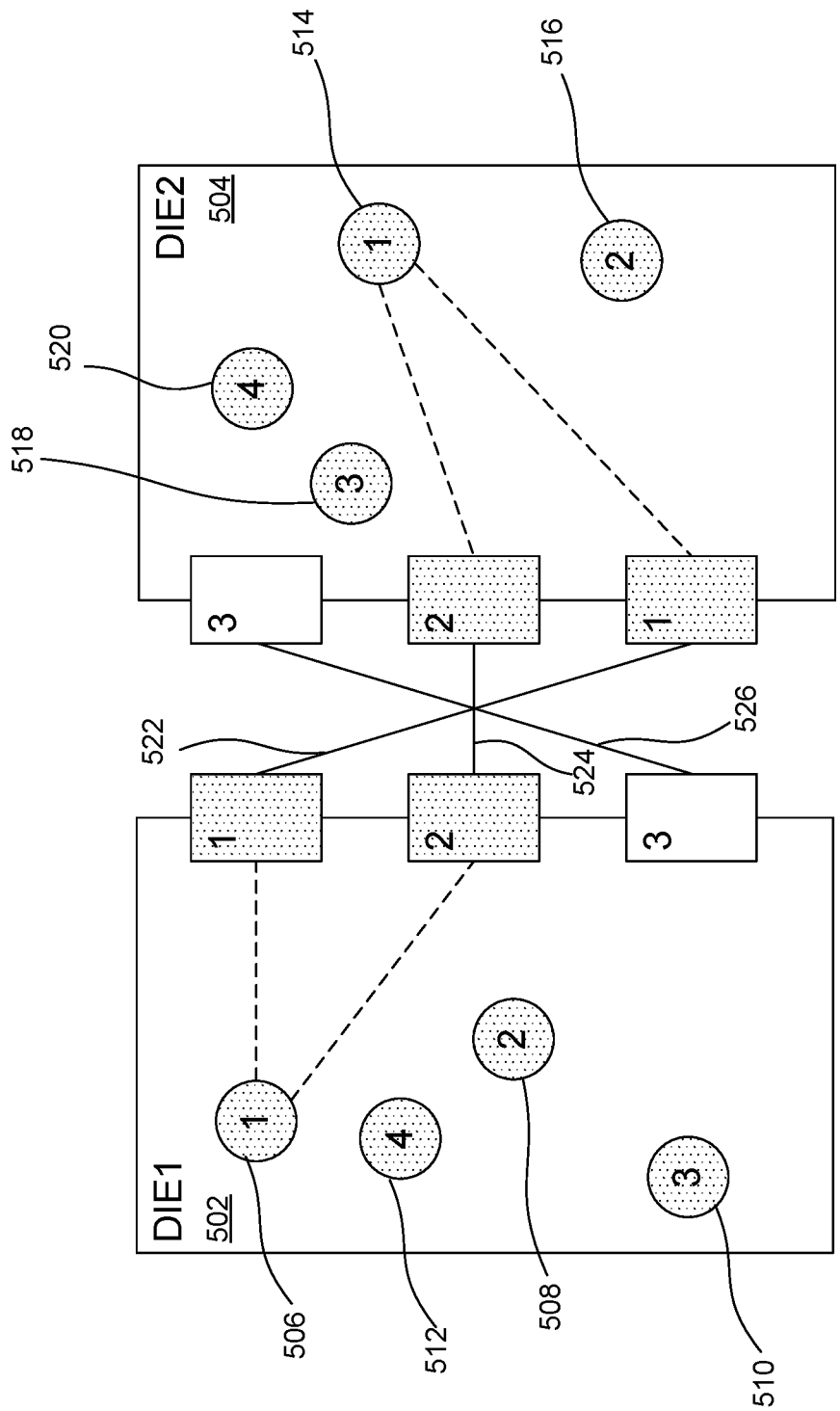
FIGS. 5-13 illustrate steps for the process for pin and channel assignment, in accordance with an embodiment of the present disclosure.

As shown in FIG. 5, a signal pin 506 can connect to signal pin 514 via the first channel 522 or the second channel 524 because the first channel 522 and the second channel 524 have the same XDR value as the signal pin 502. The dotted lines in the first FPGA 502 represent the possible connection of the signal pin 506 to the physical ports of the first channel 522 or the second channel 524, respectively. Similarly, the dotted lines in the second FPGA 504 represent the possible connections from the physical ports of the first channel 522 and the physical port of the second channel 524 to the signal port 514. Signal pair 508, 516, signal pair 510,518, and signal pair 512, 520 may connect via the first channel 506 or the second channel 508.

Figure 6:
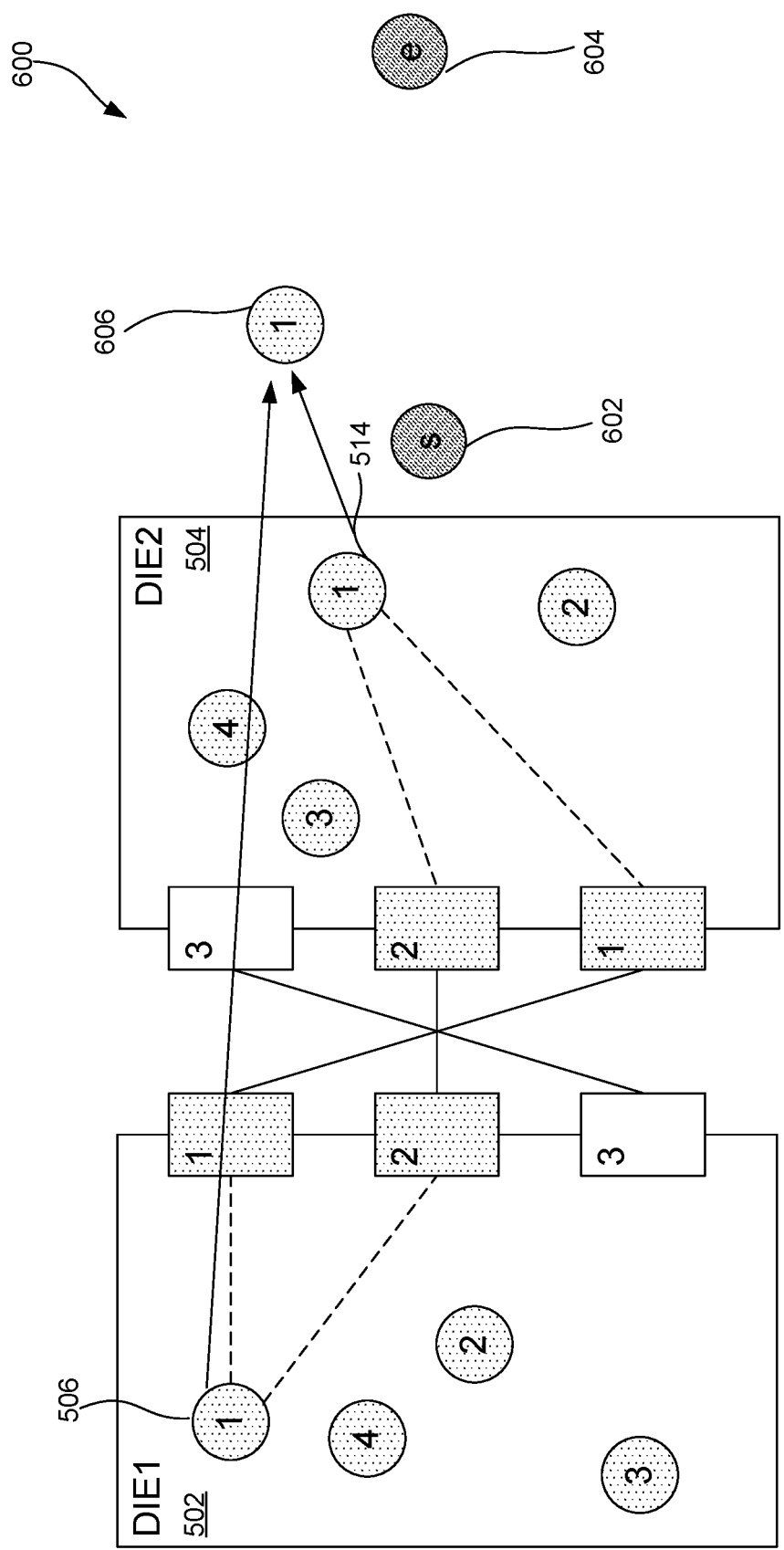
Figure 7:
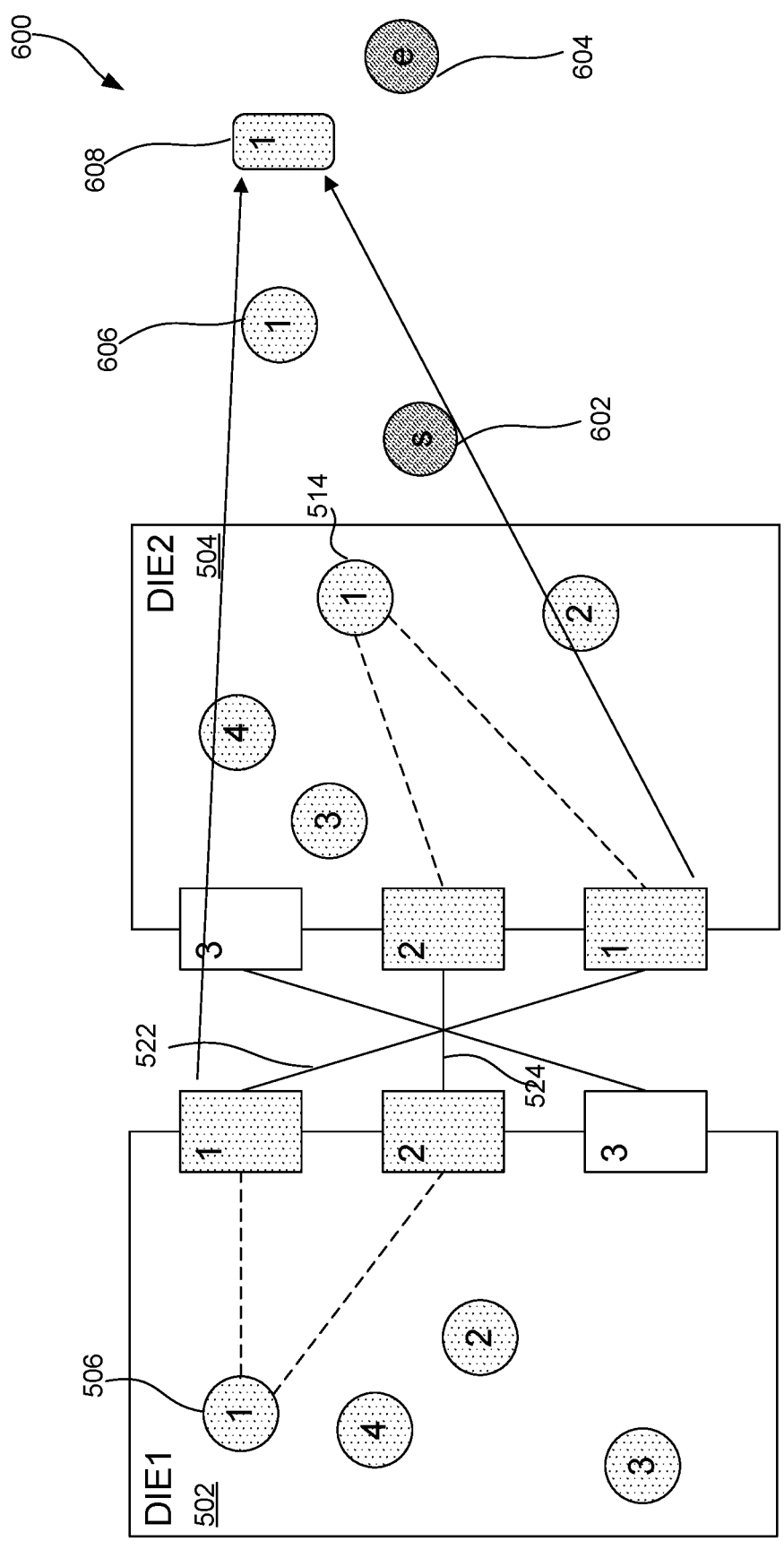
Figure 8:
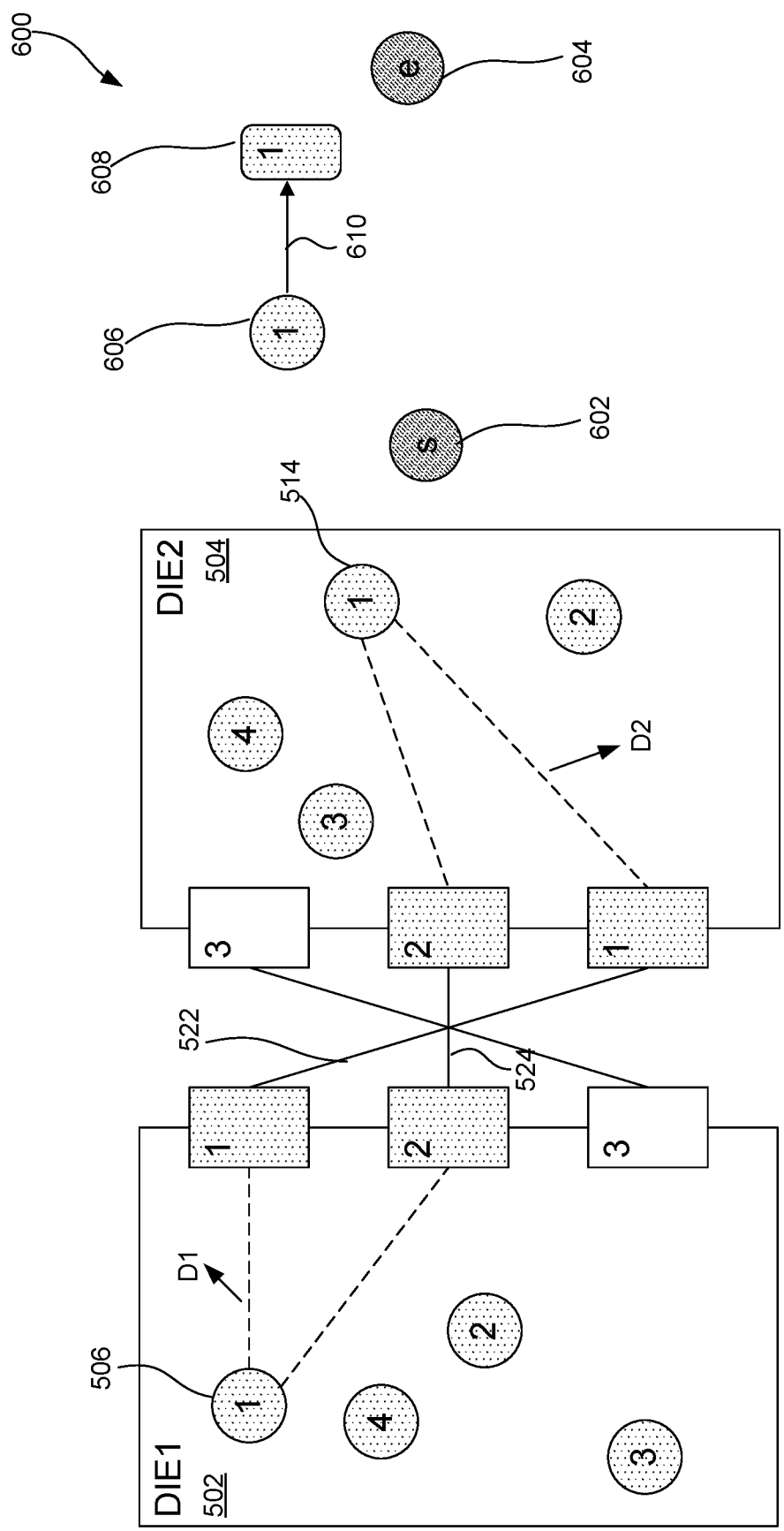

The signal-channel assignment is identified using the min-cost max-flow algorithm. A network graph 600 is constructed. A start node 602 and end node 604 are created. A node is created for each signal port. For example, a signal node 606 is created for signal pin 506 as shown in FIG. 6. A channel node is created for each channel. For example, a channel node 608 is created for the first channel 522, as shown in FIG. 7. Then, an edge is created between each signal node and channel node. For example, a first edge 610 is created between the signal node 606 and the channel node 608, as shown in FIG. 8.

Since each channel has a fixed coordinate (fixed in hardware), the first edge 610 is annotated with a capacity equal to one and with a total distance (i.e., left die distance+ right die distance) as weight. The left die distance may represent a distance in the first FPGA 502 between the signal pin and the channel. The right die distance may represent the distance between the channel and the signal pin in the second FPGA 504. In FIG. 8, D1 represents the left die distance between the signal pin 506 and the channel 522 and D2 represents the right die distance between the channel 522 and signal pin 514. Thus, the weight for the first edge 610 is equal to D1+D2. A second edge 612 is added between the start node 602 and the signal node 606. The second edge 612 has a capacity equal to one and a weight equal to zero.

Figure 9:
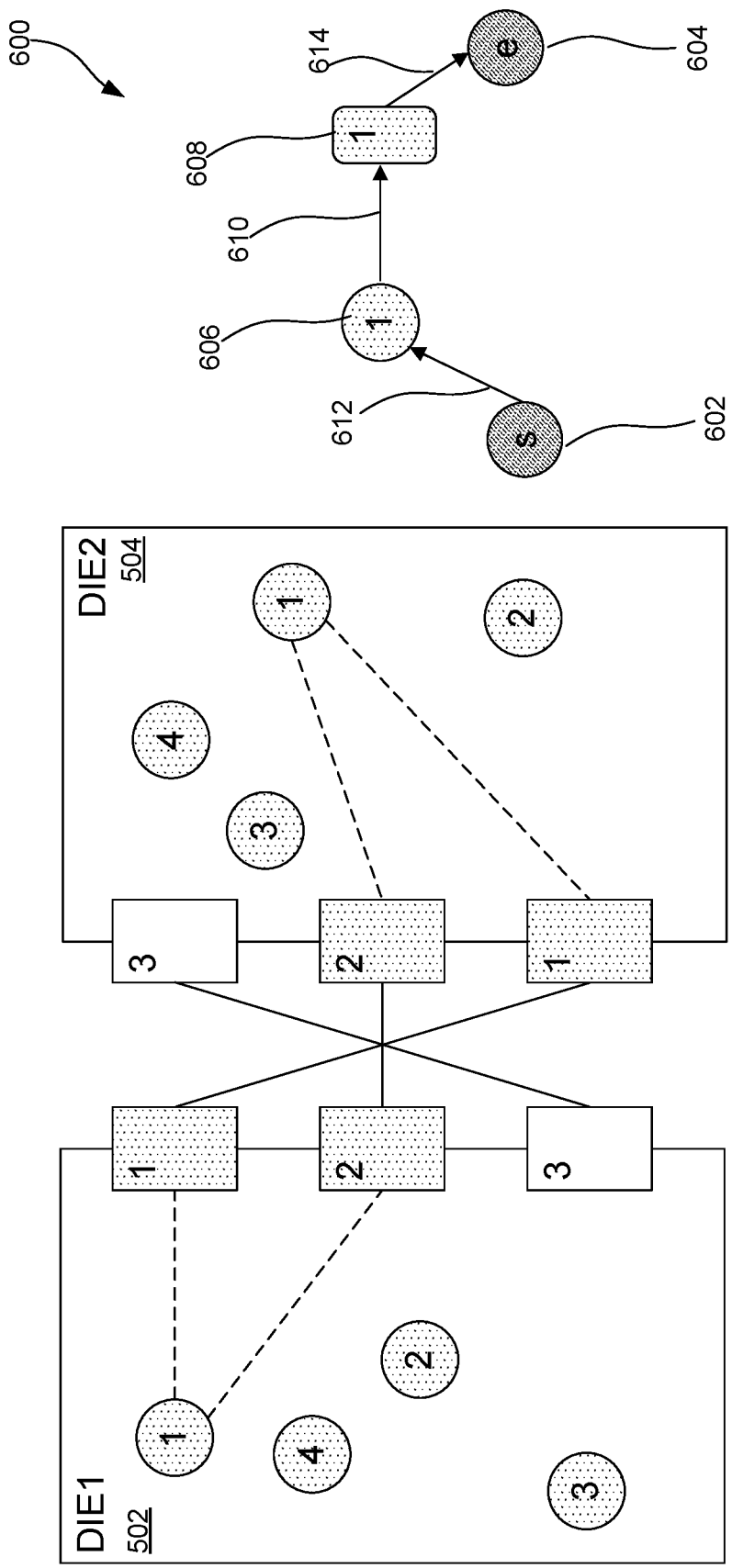

A third edge 614 is added between the channel node 608 and the end node 604 as shown in FIG. 9. The third edge has a weight of zero and a capacity equals to the XDR value.

Figure 10:
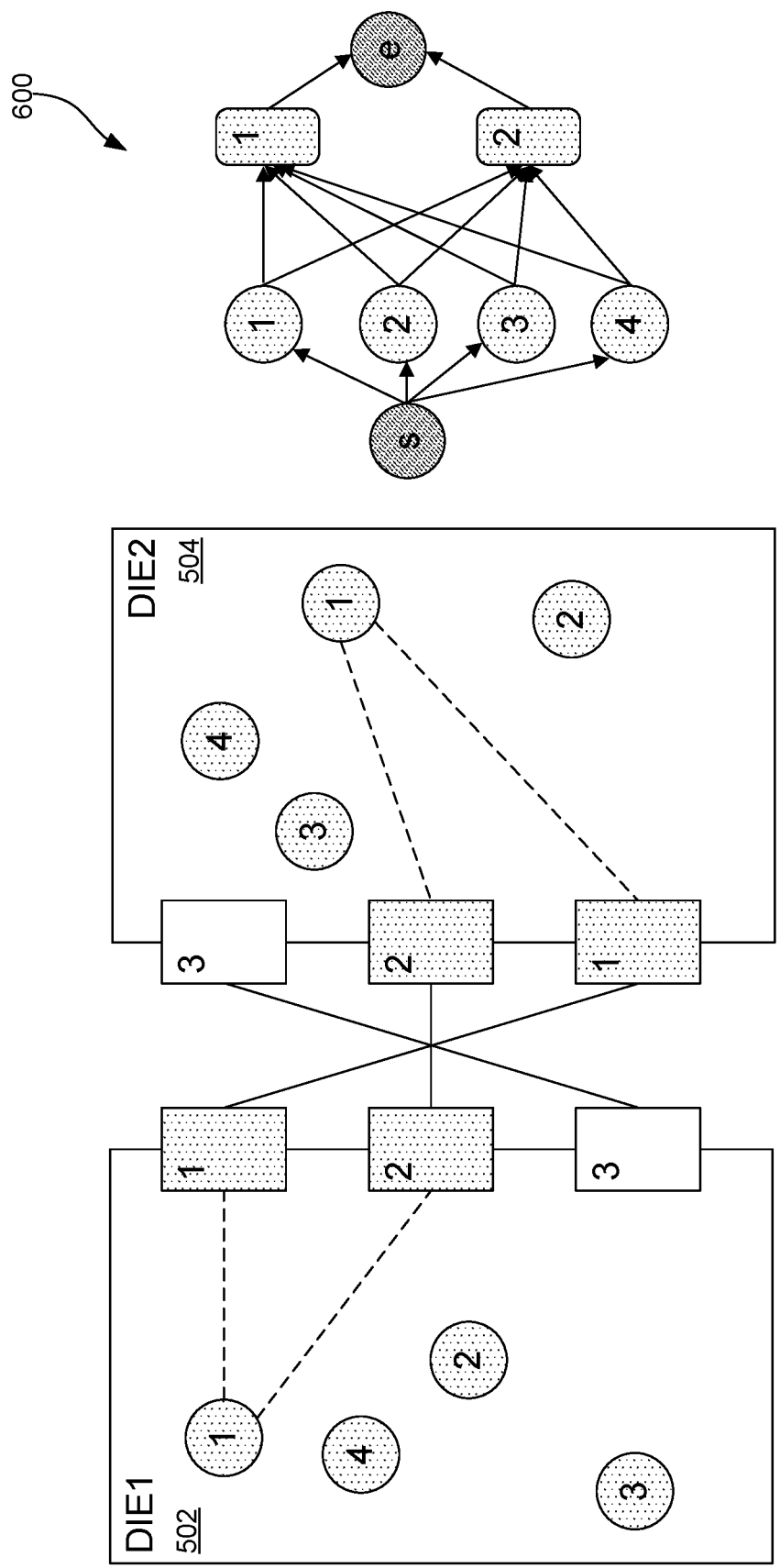

Then, the process is repeated for all remaining signal pins. The completed network graph 600 is shown in FIG. 10.

The min-max flow problem is solved using a numerical technique such as Edmonds and Karp network flow method to obtain the signal pin-channel assignment. Other numerical techniques may be used. A signal pin is assigned to a channel if there is a flow in the corresponding network graph. The Edmonds and Karp technique may use a breadth-first search for finding augmenting paths in the network. The flow from the start node to the end node is incremented by finding a flow-augmenting path. The flow is increased by the maximum capacity found in the path. The maximum flow is found when there are no more flow-augmenting paths. In some embodiments, the flows in all edges is set to zero and a residual graph is equal to the network graph. Then, the shortest path between the start node and the end node is determined. The shortest path may be found using a breadth-first search. The shortest path may be the path in the residual graph that has the minimum number of edges. The maximum flow for the shortest path is determined. The flow in the residual graph is updated. The process is repeated until all paths between the start node and the end node are at full capacity.

Figure 11:
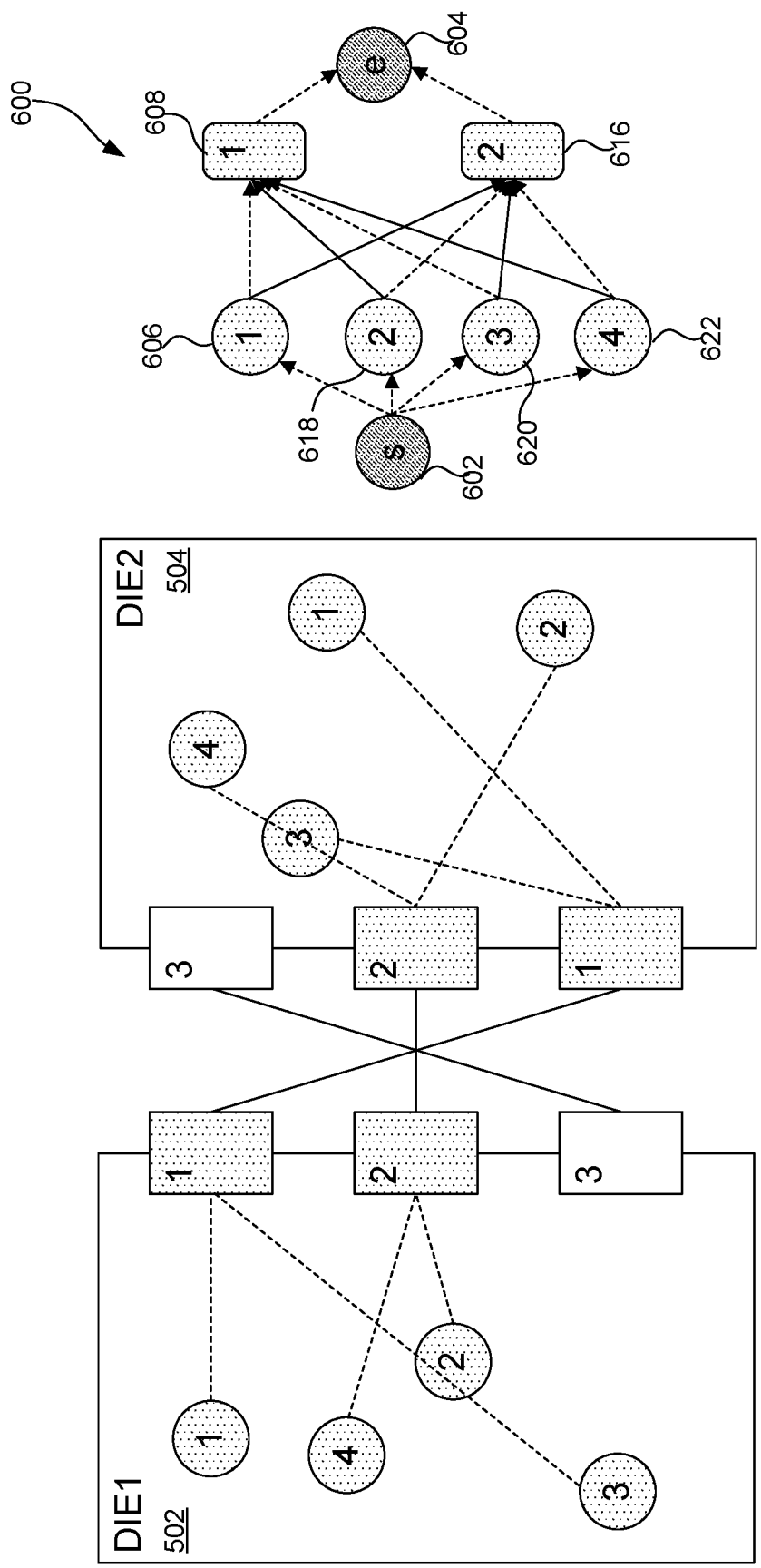

FIG. 11 shows the network graph 600 after applying the min-cost max-flow algorithm, in accordance with an embodiment. Solid lines in the network graph 600 represent flow between the signal nodes and the channel nodes. Dashed lines represent that there is no flow between the signal node and the channel node. For example, there is flow between signal node 606 and channel node 616 and between signal node 624 and channel node 616. Thus, signal pins 506, 510 are assigned to the second channel 524. Signal pins 508 and 512 are assigned to the first channel 522.

As described above, in 408 of process 400, the channels are re-configured. The reconfiguration of the channels includes determining whether under the current channel configuration, the total distance is minimal for the current channel configuration. Another channel that further reduces the total distance may be found for all signal associated with a channel.

Figure 12:
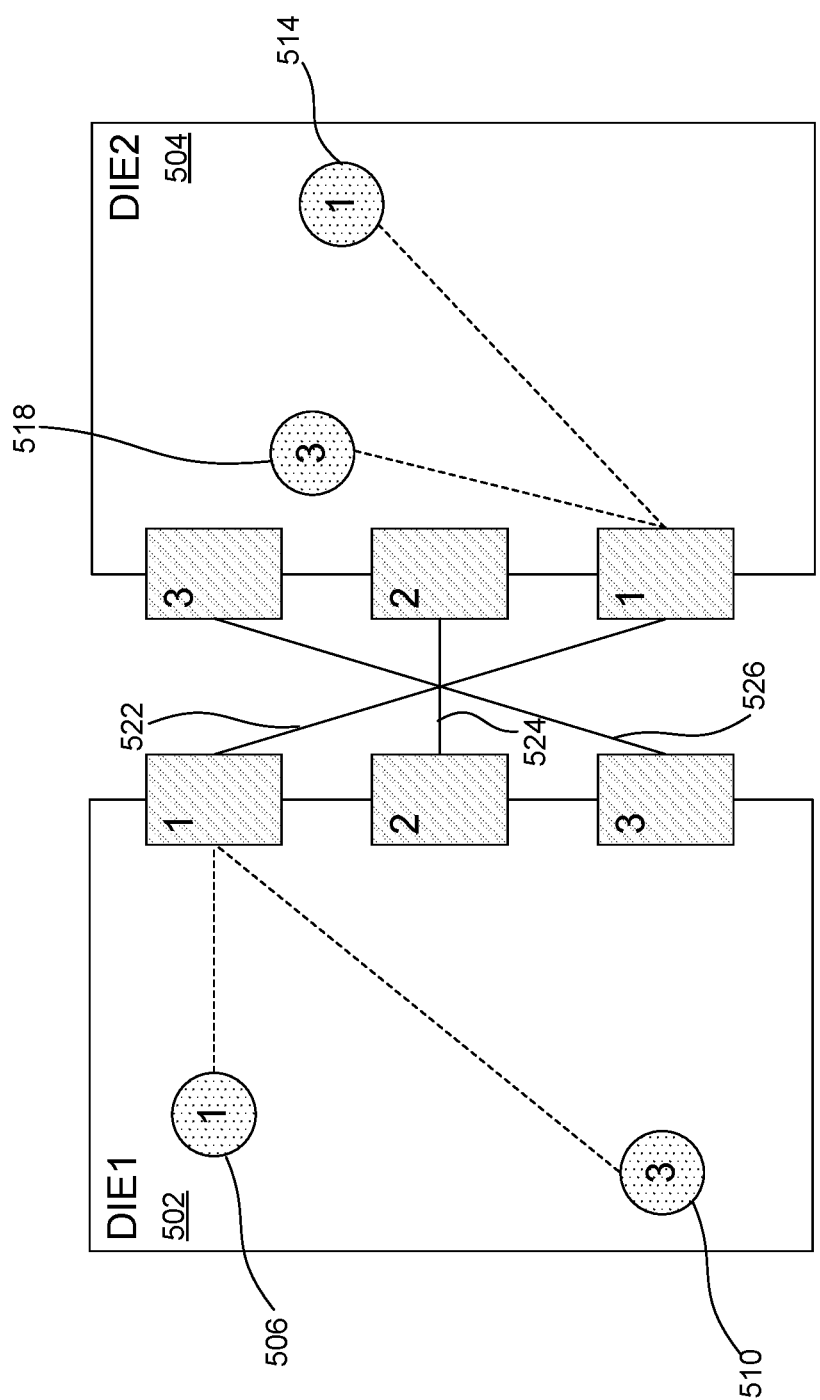

For example, for the graph shown in FIG. 12, the distance for all wires connected to channel 1 may be expressed as abs(y1−y_ch1)+abs(y1'−y_ch1')+abs(y3−y_ch1)+abs(y3−y_ch1') (x distance may be ignored since x distance will not change) where x1, y1 are the coordinates of signal port 506 and x1', y1' are the coordinate of signal pin 510. x3, y3 are the coordinates of signal port 514 at the transmitter side (i.e., first FPGA 500). x3', y3' are the coordinates of signal pin 518 at the receiver side (i.e., second FPGA 502). y_ch1 is the y coordinate of the first channel 522 at the transmitter side, y_ch1' is the y coordinate of the first channel 522 at the receiver size, y_ch2 and y_ch2' are the y coordinates of the second channel 524 at the transmitter side and at the receiver side, respectively. y_ch3 and y_ch3' are the y coordinates of the third channel 526 at the transmitter side and at the receiver side, respectively. Since y_ch1'=die_height−y_ch1 (physical property), the distance can be written as Σabs(yi−y_ch1)+abs(die_height−yi'−y_ch1) for i=1 or 2. yi, yi' and die_height are already known. The optimal value for y_ch is the median value of all values yi and (die_height−yi').

Figure 13:
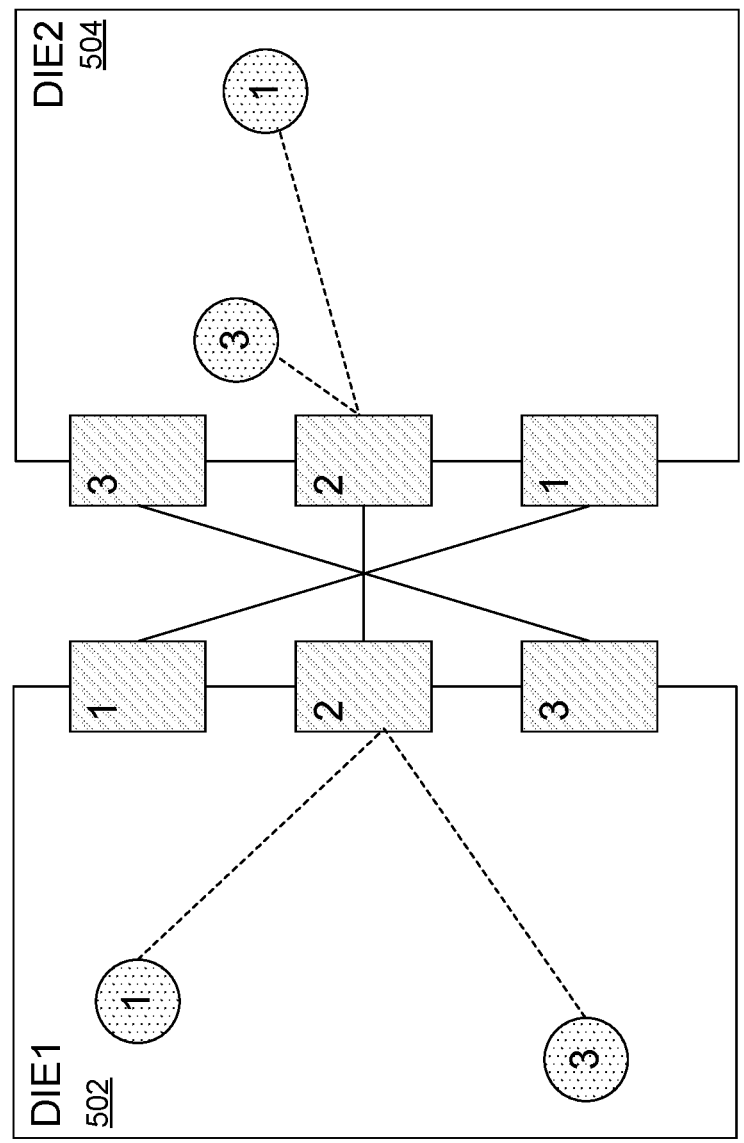
Figure 14:
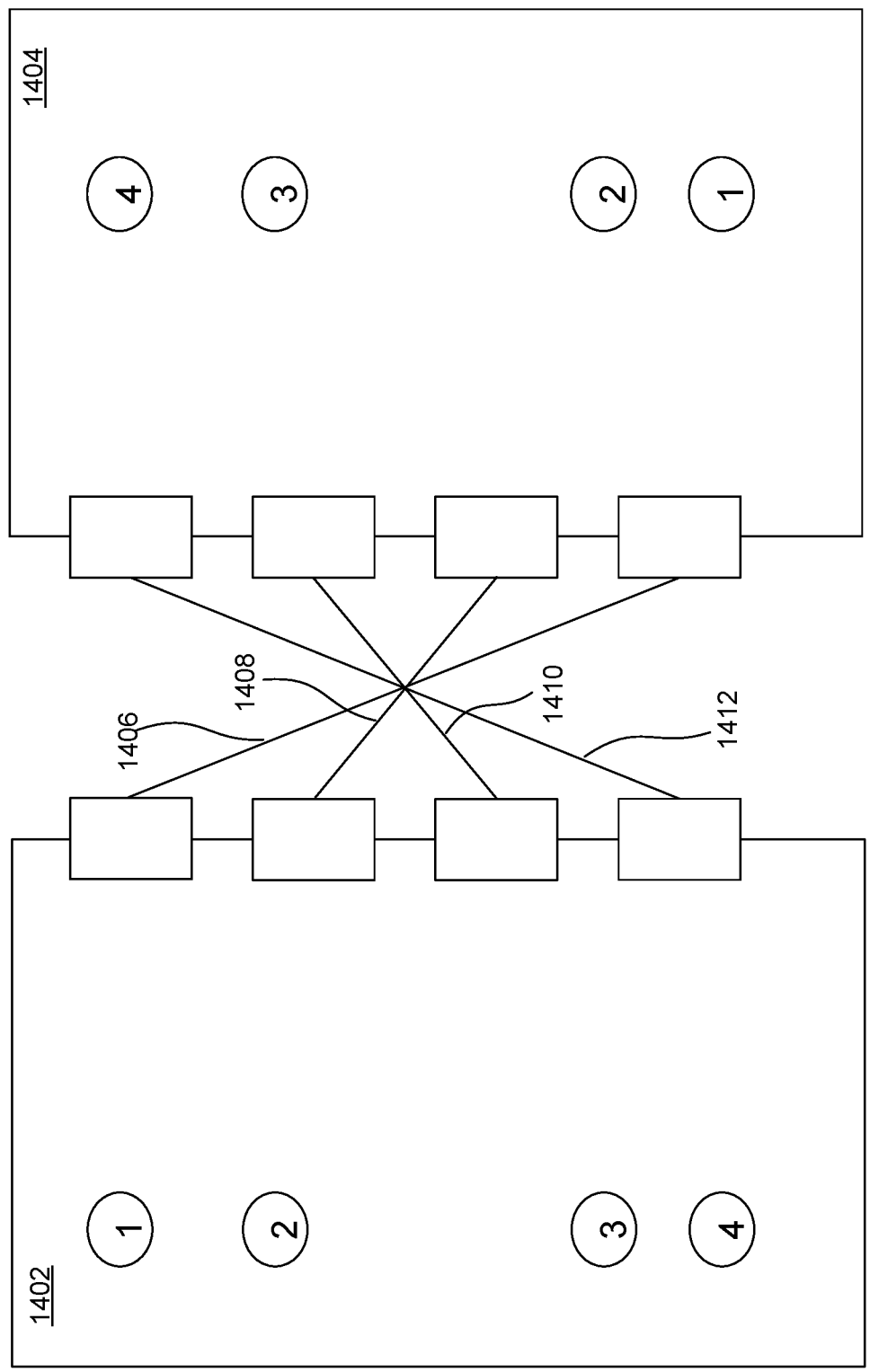
FIGS. 14-19 illustrate steps for the process for pin and channel assignment, in accordance with an embodiment of the present disclosure.

Suppose an optimal channel position is 2 in the example of FIG. 12. The channel position refers to coordinates of the channel. The total distance for wire 1 and wire 3 is determined when all the wires are connected via the second channel 524. Wire 1 represents the connection from signal pin 506 to channel 524 and from channel 524 to signal pin 514. Wire 3 represents the connection from signal pin 510 to channel 524 and from channel 524 to signal pin 518. If the total distance is less than the previous one, then wire 1 and wire 3 are reconfigured to channel 2 to further reduce the distance as shown in FIG. 13. Signals connected to the same channel are treated as a group. For example, signal port 506 and signal port 510 belong to the same group. The same procedure is repeated for all channels for which signals are assigned to in 406 of process 400. In the example, the third channel 526 is not reconfigured because no signals are assigned to the third channel 526. The channel assignment for a group for which the distance is minimized is selected.

As discussed previously herein, after the channel reconfiguration is completed and updated channel configurations are determined, the pin-pair channel assignment are re-optimized. The iterations (i.e., steps 406 and 408) stop if no further wire length reduction is obtained or a maximum iteration number is reached. In each iteration, the total distance decreases, thus the algorithm can converge.

Figure 15:
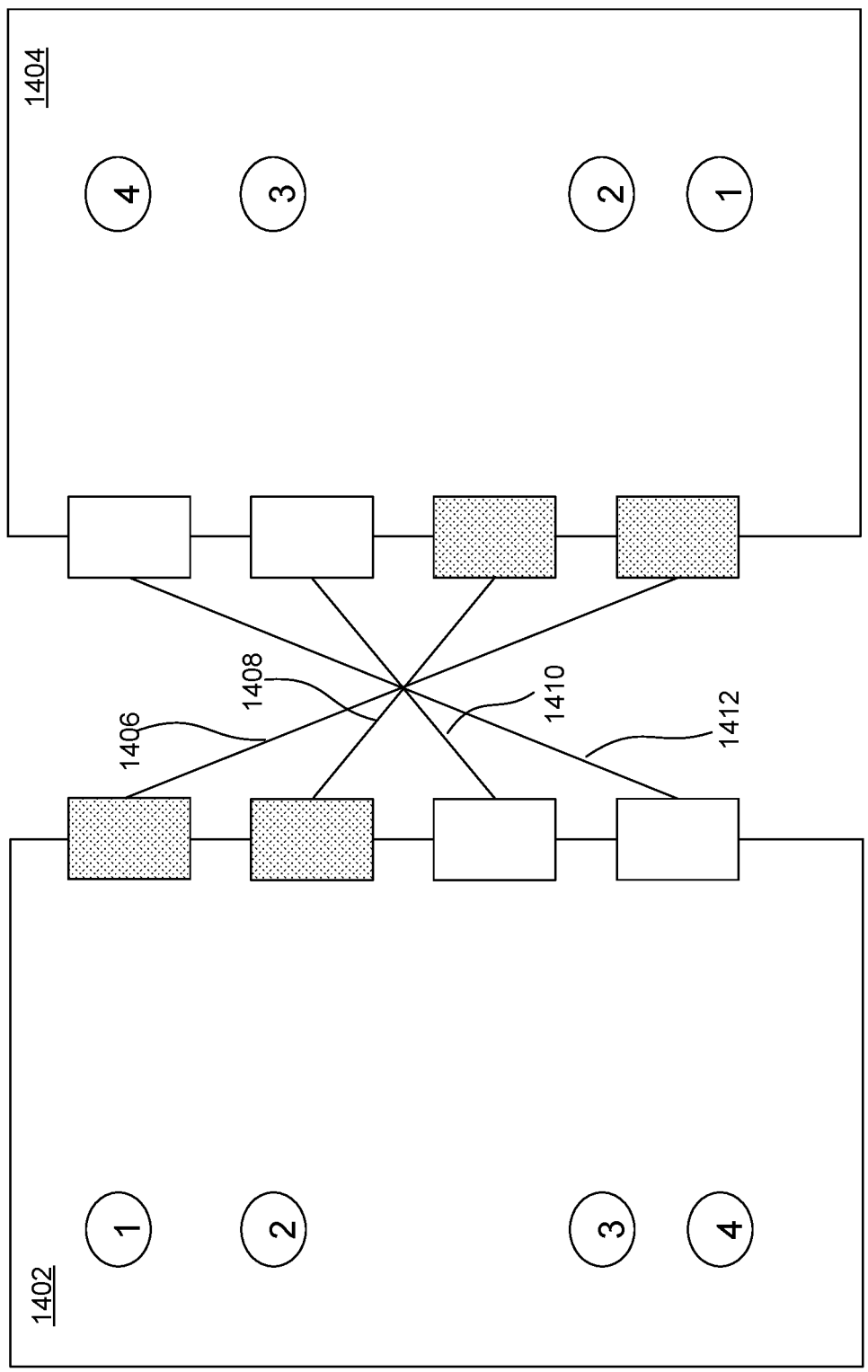

FIGS. 14-19 illustrate pin assignment in accordance with an embodiment of the present disclosure. In one example, a first FPGA 1402 may include four signal pins. A second FPGA 1404 may include four corresponding signal pins. In one example, all signals have an XDR equals to two (XDR=2). In one example, a first channel 1406, a second channel 1408, a third channel 1410, and a fourth channel 1412 may connect the first FPGA 1402 and the second FPGA 1404. The first channel 1406, the second channel 1408, the third channel 1410, and the fourth channel 1412 have an XDR equal to two. During initialization, the first two channels may be selected. For example, the first channel 1402 and the second channel 1404 may be selected for signal-channel assignment as shown in FIG. 15.

Figure 16:
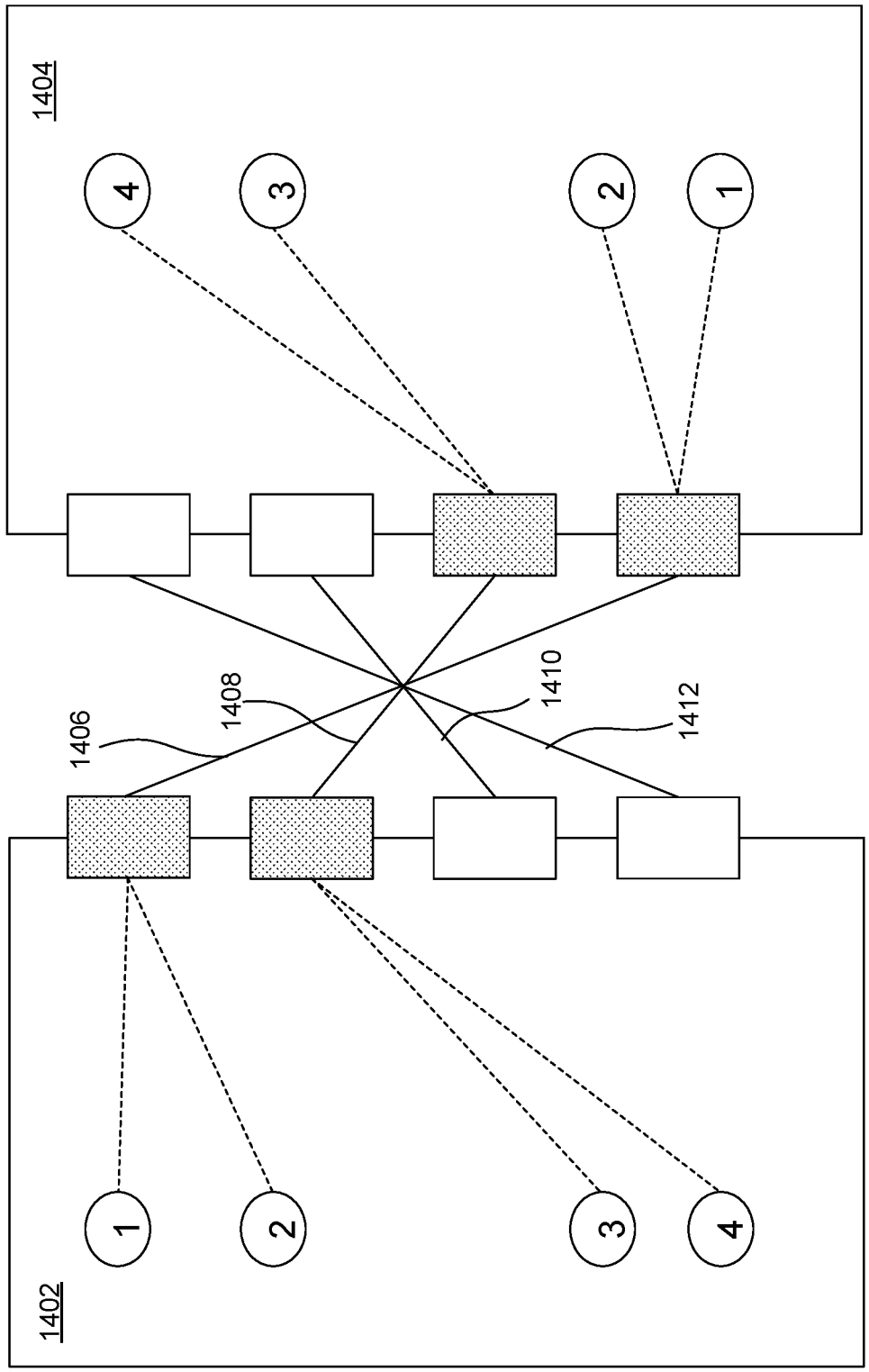

A min-max flow algorithm is implemented to determine signal pin-channel assignment as previously described herein. For example, a first signal pin 1 and a second signal pin 2 are assigned to the first channel 1402. A third signal pin 3 and a fourth signal pin 4 are assigned to the second channel 1404 as shown in FIG. 16. During channel reconfiguration, the channels may be re-assigned for each signal group. The first signal pin 1 and the second signal pin 2 may form a first signal group. The third signal pin 3 and the fourth signal pin 4 may form a second signal group. The signal pins of one of the signal groups may be reassigned to another channel. For example, the third signal pin 3 and the fourth signal pin 4 may be reassigned to the channel 1408 as shown in FIG. 17.

Figure 17:
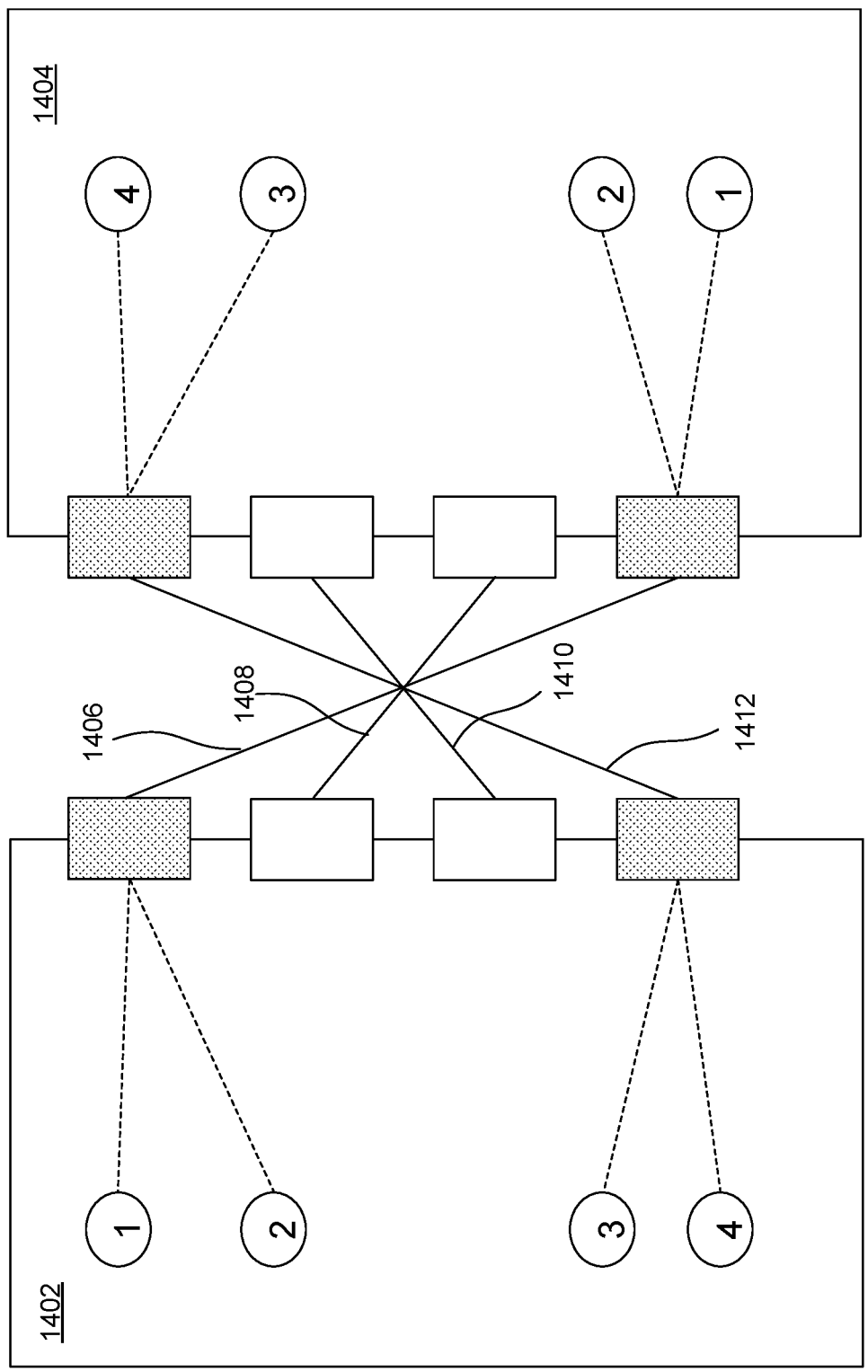
Figure 18:
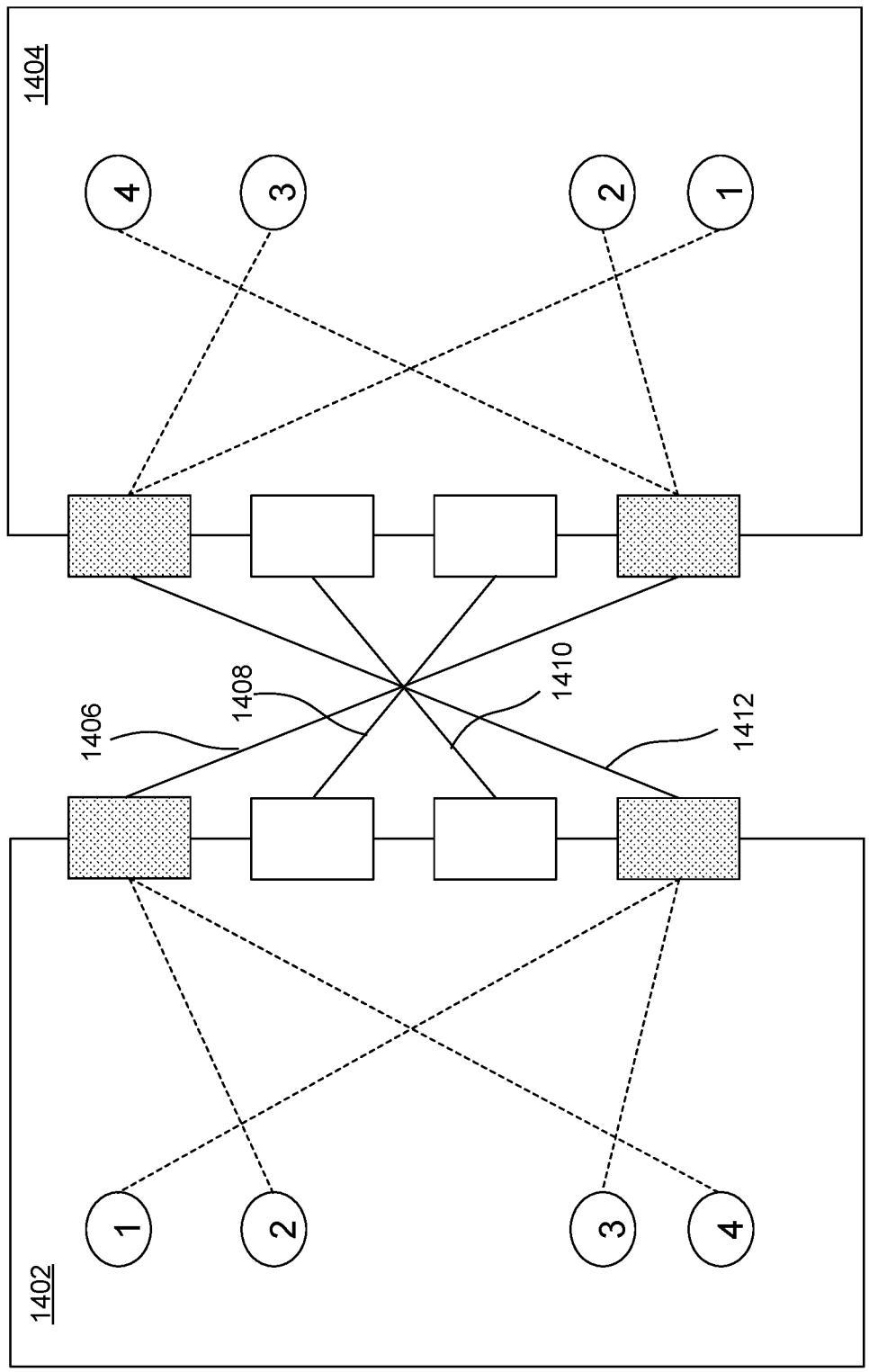
Figure 19:
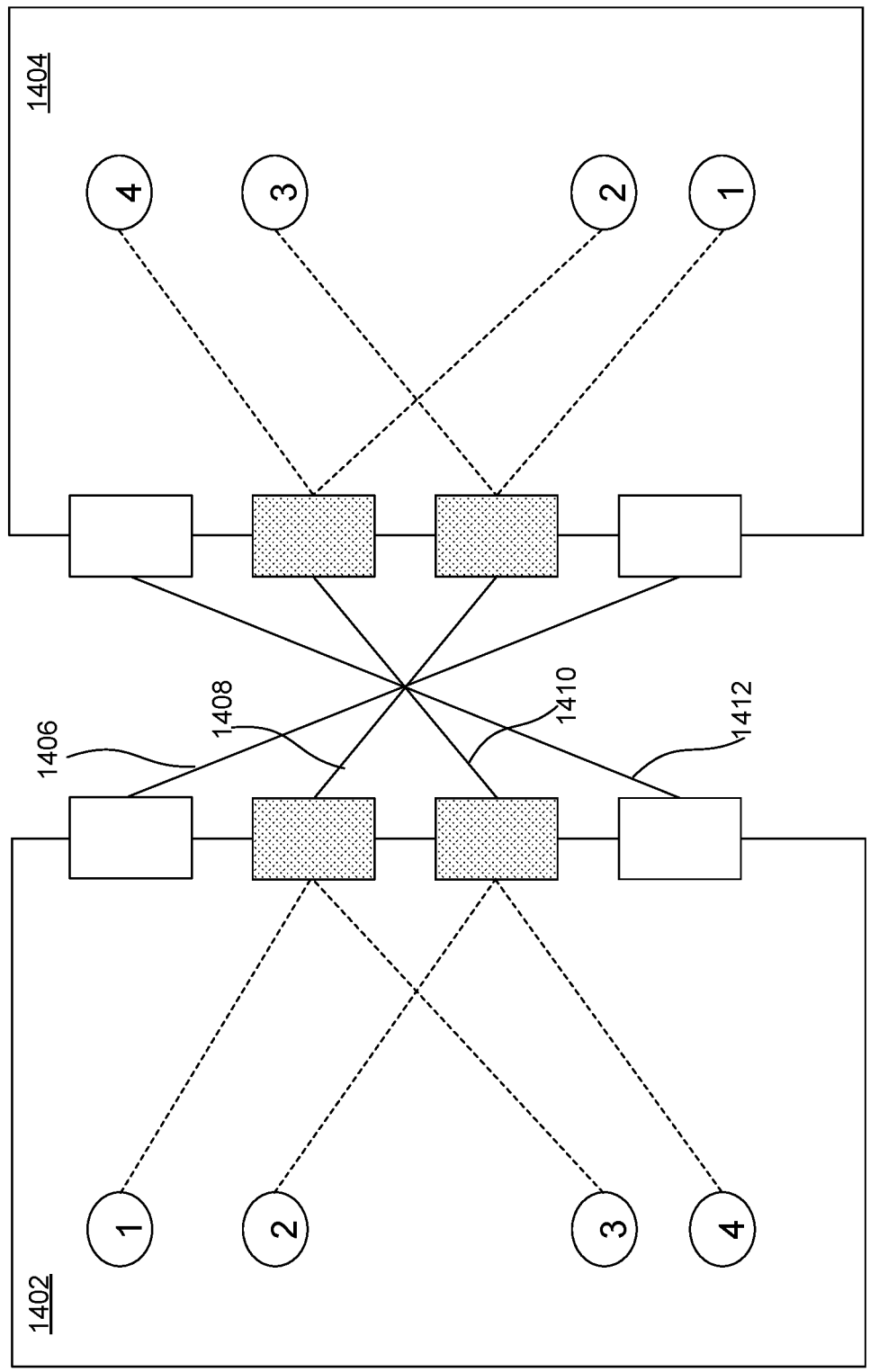

In some embodiments, the signal pin channel assignment may be determined based on the channel configuration shown in FIG. 17. Channels may be reassigned for each signal group as shown in FIG. 18. For example, the first signal pin 1 and the third signal pin 3 may be reassigned to the fourth channel 1412. The second signal pin 2 and the fourth signal pin 4 may be reassigned to the first channel 1406. Then, the channel may be reconfigured as shown in FIG. 19. The first signal pin 1 and the third signal pin 3 form a signal group. The first signal pin 1 and the third signal pin 3 may be reassigned to the second channel 1408. The second signal pin 2 and the fourth signal pin 4 may be reassigned to the third channel 1410.

Figure 20:
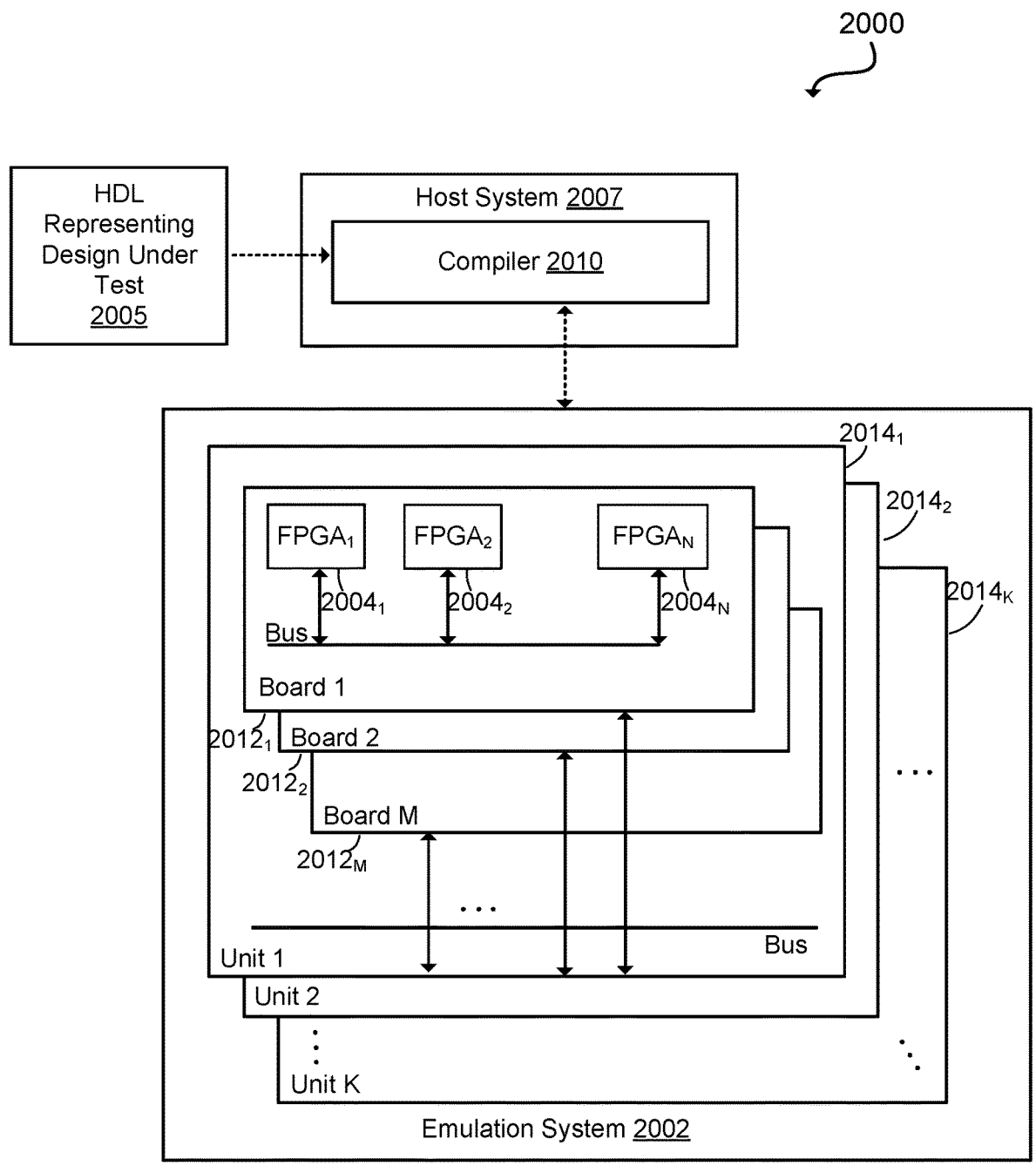
FIG. 20 depicts a diagram of an example emulation system in accordance with some embodiments of the present disclosure.

FIG. 20 depicts a diagram of an example emulation environment 2000. An emulation environment 2000 may be configured to verify the functionality of the circuit design. The emulation environment 2000 may include a host system 2007 (e.g., a computer that is part of an EDA system) and an emulation system 2002 (e.g., a set of programmable devices such as Field Programmable Gate Arrays (FPGAs) or processors). The host system generates data and information by using a compiler 2010 to structure the emulation system to emulate a circuit design. A circuit design to be emulated is also referred to as a Design Under Test ('DUT') where data and information from the emulation are used to verify the functionality of the DUT.

The host system 2007 may include one or more processors. In the embodiment where the host system includes multiple processors, the functions described herein as being performed by the host system can be distributed among the multiple processors. The host system 2007 may include a compiler 2010 to transform specifications written in a description language that represents a DUT and to produce data (e.g., binary data) and information that is used to structure the emulation system 2002 to emulate the DUT. The compiler 2010 can transform, change, restructure, add new functions to, and/or control the timing of the DUT.

The host system 2007 and emulation system 2002 exchange data and information using signals carried by an emulation connection. The connection can be, but is not limited to, one or more electrical cables such as cables with pin structures compatible with the Recommended Standard 232 (RS232) or universal serial bus (USB) protocols. The connection can be a wired communication medium or network such as a local area network or a wide area network such as the Internet. The connection can be a wireless communication medium or a network with one or more points of access using a wireless protocol such as BLUETOOTH or IEEE 802.11. The host system 2007 and emulation system 2002 can exchange data and information through a third device such as a network server.

The emulation system 2002 includes multiple FPGAs (or other modules) such as FPGAs $2004_1$ and $2004_2$ as well as additional FPGAs to $2004_N$. Each FPGA can include one or more FPGA interfaces through which the FPGA is connected to other FPGAs (and potentially other emulation components) for the FPGAs to exchange signals. An FPGA interface can be referred to as an input/output pin or an FPGA pad. While an emulator may include FPGAs, embodiments of emulators can include other types of logic blocks instead of, or along with, the FPGAs for emulating DUTs. For example, the emulation system 2002 can include custom FPGAs, specialized ASICs for emulation or prototyping, memories, and input/output devices.

A programmable device can include an array of programmable logic blocks and a hierarchy of interconnections that can enable the programmable logic blocks to be interconnected according to the descriptions in the HDL code. Each of the programmable logic blocks can enable complex combinational functions or enable logic gates such as AND, and XOR logic blocks. In some embodiments, the logic blocks also can include memory elements/devices, which can be simple latches, flip-flops, or other blocks of memory. Depending on the length of the interconnections between different logic blocks, signals can arrive at input terminals of the logic blocks at different times and thus may be temporarily stored in the memory elements/devices.

FPGAs $2004_1$-$2004_N$ may be placed onto one or more boards $2012_1$ and $2012_2$ as well as additional boards through $2012_M$. Multiple boards can be placed into an emulation unit $2014_1$. The boards within an emulation unit can be connected using the backplane of the emulation unit or any other types of connections. In addition, multiple emulation units (e.g., $2014_1$ and $2014_2$ through $2014_K$) can be connected to each other by cables or any other means to form a multi-emulation unit system.

For a DUT that is to be emulated, the host system 2007 transmits one or more bit files to the emulation system 2002. The bit files may specify a description of the DUT and may further specify partitions of the DUT created by the host system 2007 with trace and injection logic, mappings of the partitions to the FPGAs of the emulator, and design constraints. Using the bit files, the emulator structures the FPGAs to perform the functions of the DUT. In some embodiments, one or more FPGAs of the emulators may have the trace and injection logic built into the silicon of the FPGA. In such an embodiment, the FPGAs may not be structured by the host system to emulate trace and injection logic.

The host system 2007 receives a description of a DUT that is to be emulated. In some embodiments, the DUT description is in a description language (e.g., a register transfer language (RTL)). In some embodiments, the DUT description is in netlist level files or a mix of netlist level files and HDL files. If part of the DUT description or the entire DUT description is in an HDL, then the host system can synthesize the DUT description to create a gate level netlist using the DUT description. A host system can use the netlist of the DUT to partition the DUT into multiple partitions where one or more of the partitions include trace and injection logic. The trace and injection logic traces interface signals that are exchanged via the interfaces of an FPGA. Additionally, the trace and injection logic can inject traced interface signals into the logic of the FPGA. The host system maps each partition to an FPGA of the emulator. In some embodiments, the trace and injection logic is included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic are included, the bit files also describe the logic that is included. The bit files can include place and route information and design constraints. The host system stores the bit files and information describing which FPGAs are to emulate each component of the DUT (e.g., to which FPGAs each component is mapped).

Upon request, the host system transmits the bit files to the emulator. The host system signals the emulator to start the emulation of the DUT. During emulation of the DUT or at the end of the emulation, the host system receives emulation results from the emulator through the emulation connection. Emulation results are data and information generated by the emulator during the emulation of the DUT which include interface signals and states of interface signals that have been traced by the trace and injection logic of each FPGA. The host system can store the emulation results and/or transmits the emulation results to another processing system.

After emulation of the DUT, a circuit designer can request to debug a component of the DUT. If such a request is made, the circuit designer can specify a time period of the emulation to debug. The host system identifies which FPGAs are emulating the component using the stored information. The host system retrieves stored interface signals associated with the time period and traced by the trace and injection logic of each identified FPGA. The host system signals the emulator to re-emulate the identified FPGAs. The host system transmits the retrieved interface signals to the emulator to re-emulate the component for the specified time period. The trace and injection logic of each identified FPGA injects its respective interface signals received from the host system into the logic of the DUT mapped to the FPGA. In case of multiple re-emulations of an FPGA, merging the results produces a full debug view.

The host system receives, from the emulation system, signals traced by logic of the identified FPGAs during the re-emulation of the component. The host system stores the signals received from the emulator. The signals traced during the re-emulation can have a higher sampling rate than the sampling rate during the initial emulation. For example, in the initial emulation a traced signal can include a saved state of the component every X milliseconds. However, in the re-emulation the traced signal can include a saved state every Y milliseconds where Y is less than X. If the circuit designer requests to view a waveform of a signal traced during the re-emulation, the host system can retrieve the stored signal and display a plot of the signal. For example, the host system can generate a waveform of the signal. Afterwards, the circuit designer can request to re-emulate the same component for a different time period or to re-emulate another component.

A host system 2007 and/or the compiler 2010 may include sub-systems such as, but not limited to, a design synthesizer sub-system, a mapping sub-system, a run time sub-system, a results sub-system, a debug sub-system, a waveform sub-system, and a storage sub-system. The sub-systems can be structured and enabled as individual or multiple modules or two or more may be structured as a module. Together these sub-systems structure the emulator and monitor the emulation results.

The design synthesizer sub-system transforms the HDL that is representing a DUT 2005 into gate level logic. For a DUT that is to be emulated, the design synthesizer sub-system receives a description of the DUT. If the description of the DUT is fully or partially in HDL (e.g., RTL or other level of abstraction), the design synthesizer sub-system synthesizes the HDL of the DUT to create a gate-level netlist with a description of the DUT in terms of gate level logic.

The mapping sub-system partitions DUTs and maps the partitions into emulator FPGAs. The mapping sub-system partitions a DUT at the gate level into a number of partitions using the netlist of the DUT. For each partition, the mapping sub-system retrieves a gate level description of the trace and injection logic and adds the logic to the partition. As described above, the trace and injection logic included in a partition is used to trace signals exchanged via the interfaces of an FPGA to which the partition is mapped (trace interface signals). The trace and injection logic can be added to the DUT prior to the partitioning. For example, the trace and injection logic can be added by the design synthesizer sub-system prior to or after the synthesizing the HDL of the DUT.

In addition to including the trace and injection logic, the mapping sub-system can include additional tracing logic in a partition to trace the states of certain DUT components that are not traced by the trace and injection. The mapping sub-system can include the additional tracing logic in the DUT prior to the partitioning or in partitions after the partitioning. The design synthesizer sub-system can include the additional tracing logic in an HDL description of the DUT prior to synthesizing the HDL description.

The mapping sub-system maps each partition of the DUT to an FPGA of the emulator. For partitioning and mapping, the mapping sub-system uses design rules, design constraints (e.g., timing or logic constraints), and information about the emulator. For components of the DUT, the mapping sub-system stores information in the storage sub-system describing which FPGAs are to emulate each component.

Using the partitioning and the mapping, the mapping sub-system generates one or more bit files that describe the created partitions and the mapping of logic to each FPGA of the emulator. The bit files can include additional information such as constraints of the DUT and routing information of connections between FPGAs and connections within each FPGA. The mapping sub-system can generate a bit file for each partition of the DUT and can store the bit file in the storage sub-system. Upon request from a circuit designer, the mapping sub-system transmits the bit files to the emulator, and the emulator can use the bit files to structure the FPGAs to emulate the DUT.

If the emulator includes specialized ASICs that include the trace and injection logic, the mapping sub-system can generate a specific structure that connects the specialized ASICs to the DUT. In some embodiments, the mapping sub-system can save the information of the traced/injected signal and where the information is stored on the specialized ASIC.

The run time sub-system controls emulations performed by the emulator. The run time sub-system can cause the emulator to start or stop executing an emulation. Additionally, the run time sub-system can provide input signals and data to the emulator. The input signals can be provided directly to the emulator through the connection or indirectly through other input signal devices. For example, the host system can control an input signal device to provide the input signals to the emulator. The input signal device can be, for example, a test board (directly or through cables), signal generator, another emulator, or another host system.

The results sub-system processes emulation results generated by the emulator. During emulation and/or after completing the emulation, the results sub-system receives emulation results from the emulator generated during the emulation. The emulation results include signals traced during the emulation. Specifically, the emulation results include interface signals traced by the trace and injection logic emulated by each FPGA and can include signals traced by additional logic included in the DUT. Each traced signal can span multiple cycles of the emulation. A traced signal includes multiple states and each state is associated with a time of the emulation. The results sub-system stores the traced signals in the storage sub-system. For each stored signal, the results sub-system can store information indicating which FPGA generated the traced signal.

The debug sub-system allows circuit designers to debug DUT components. After the emulator has emulated a DUT and the results sub-system has received the interface signals traced by the trace and injection logic during the emulation, a circuit designer can request to debug a component of the DUT by re-emulating the component for a specific time period. In a request to debug a component, the circuit designer identifies the component and indicates a time period of the emulation to debug. The circuit designer's request can include a sampling rate that indicates how often states of debugged components should be saved by logic that traces signals.

The debug sub-system identifies one or more FPGAs of the emulator that are emulating the component using the information stored by the mapping sub-system in the storage sub-system. For each identified FPGA, the debug sub-system retrieves, from the storage sub-system, interface signals traced by the trace and injection logic of the FPGA during the time period indicated by the circuit designer. For example, the debug sub-system retrieves states traced by the trace and injection logic that are associated with the time period.

The debug sub-system transmits the retrieved interface signals to the emulator. The debug sub-system instructs the debug sub-system to use the identified FPGAs and for the trace and injection logic of each identified FPGA to inject its respective traced signals into logic of the FPGA to re-emulate the component for the requested time period. The debug sub-system can further transmit the sampling rate provided by the circuit designer to the emulator so that the tracing logic traces states at the proper intervals.

To debug the component, the emulator can use the FPGAs to which the component has been mapped. Additionally, the re-emulation of the component can be performed at any point specified by the circuit designer.

For an identified FPGA, the debug sub-system can transmit instructions to the emulator to load multiple emulator FPGAs with the same configuration of the identified FPGA. The debug sub-system additionally signals the emulator to use the multiple FPGAs in parallel. Each FPGA from the multiple FPGAs is used with a different time window of the interface signals to generate a larger time window in a shorter amount of time. For example, the identified FPGA can require an hour or more to use a certain amount of cycles. However, if multiple FPGAs have the same data and structure of the identified FPGA and each of these FPGAs runs a subset of the cycles, the emulator can require a few minutes for the FPGAs to collectively use all the cycles.

A circuit designer can identify a hierarchy or a list of DUT signals to re-emulate. To enable this, the debug sub-system determines the FPGA needed to emulate the hierarchy or list of signals, retrieves the necessary interface signals, and transmits the retrieved interface signals to the emulator for re-emulation. Thus, a circuit designer can identify any element (e.g., component, device, or signal) of the DUT to debug/re-emulate.

The waveform sub-system generates waveforms using the traced signals. If a circuit designer requests to view a waveform of a signal traced during an emulation run, the host system retrieves the signal from the storage sub-system. The waveform sub-system displays a plot of the signal. For one or more signals, when the signals are received from the emulator, the waveform sub-system can automatically generate the plots of the signals.

Figure 21:
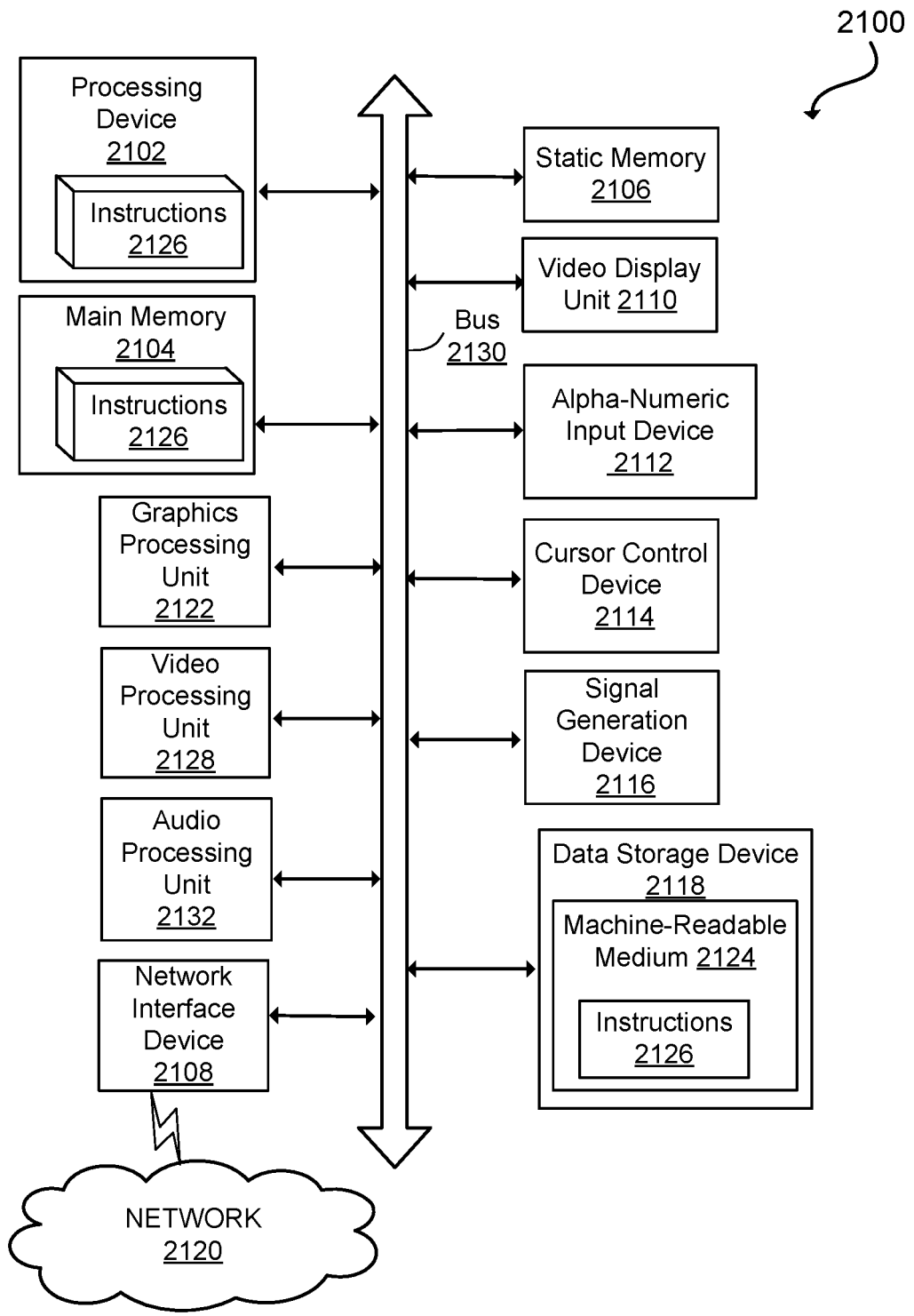
FIG. 21 depicts a diagram of an example computer system in which embodiments of the present disclosure may operate.

FIG. 21 illustrates an example machine of a computer system 2100 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 2100 includes a processing device 2102, a main memory 2104 (e.g., read-only memory (ROM), flash memory, dynamic random access memory (DRAM) such as synchronous DRAM (SDRAM), a static memory 2106 (e.g., flash memory, static random access memory (SRAM), etc.), and a data storage device 2118, which communicate with each other via a bus 2130.

Processing device 2102 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 2102 may also be one or more special-purpose processing devices such as an application specific integrated circuit (ASIC), a field programmable gate array (FPGA), a digital signal processor (DSP), network processor, or the like. The processing device 2102 may be configured to execute instructions 2126 for performing the operations and steps described herein.

The computer system 2100 may further include a network interface device 2108 to communicate over the network 2120. The computer system 2100 also may include a video display unit 2110 (e.g., a liquid crystal display (LCD) or a cathode ray tube (CRT)), an alphanumeric input device 2112 (e.g., a keyboard), a cursor control device 2114 (e.g., a mouse), a graphics processing unit 2122, a signal generation device 2116 (e.g., a speaker), graphics processing unit 2122, video processing unit 2128, and audio processing unit 2132.

The data storage device 2118 may include a machine-readable storage medium 2124 (also known as a non-transitory computer-readable medium) on which is stored one or more sets of instructions 2126 or software embodying any one or more of the methodologies or functions described herein. The instructions 2126 may also reside, completely or at least partially, within the main memory 2104 and/or within the processing device 2102 during execution thereof by the computer system 2100, the main memory 2104 and the processing device 2102 also constituting machine-readable storage media.

In some implementations, the instructions 2126 include instructions to implement functionality corresponding to the present disclosure. While the machine-readable storage medium 2124 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 2102 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
   generating a channel configuration between a first signal pin of a first integrated circuit (IC) die and a second signal pin of a second IC die based on a multiplex data rate (XDR) of the first signal pin and the second signal pin, wherein the channel configuration includes an association of the XDR to a channel;
   determining, by a processor, a signal pin channel assignment based on the channel configuration;
   updating, by the processor, the channel configuration based on the signal pin channel assignment and a wirelength representative of a total distance between the first signal pin, the second signal pin, and physical ports of the channel; and
   performing socket instantiation based on the updated channel configuration and the signal pin channel assignment.

2. The method of claim 1, further comprising:
   acquiring a design under test (DUT) data, wherein the DUT data includes the first signal pin and the second signal pin locations and the XDR associated with each of the first signal pin and the second signal pin.

3. The method of claim 1, further comprising:
   repeating the determining and updating steps until an iteration termination condition is satisfied.

4. The method of claim 3, further comprising:
   determining whether under the channel configuration satisfies a threshold wirelength condition, and
   wherein the iteration termination condition is satisfied when the threshold wirelength condition is satisfied.

5. The method of claim 1, further comprising:
   determining a first distance from the first signal pin to a first physical port of the channel in the first IC die;
   determining a second distance from the second signal pin to a second physical port of the channel in the second IC die; and
   wherein the total distance is a function of the first distance and the second distance.

6. The method of claim 1, wherein updating the channel configuration comprises:
   determining the wirelength for a group of signal pins, wherein the group of signal pins includes one or more signal pins connected to the same channel.

7. The method of claim 6, further comprising:
   assigning a signal pin of the group of signal pins to the channel and assigning another signal pin of the group of signal pins to another channel.

8. The method of claim 1, wherein determining the signal pin channel assignment comprises:
   creating a graph representative of the first signal pin of the first IC die and channels between the first IC die and the second IC die; and
   assigning the first signal pin to the channel when there is a flow in the graph between the first signal pin and the channel.

9. The method of claim 8, wherein creating the graph further comprises:
   creating a signal node for the first signal pin;
   creating a channel node for each channel of channels between the first IC die and the second IC die;
   creating a first edge between the signal node and the channel node, the first edge having a weight equal to a distance representative of the total distance between the first signal pin and the second signal pin;
   creating a start node and an end node;
   creating a second edge between the start node and the signal node; and creating a third edge between the channel node and the end node, the third edge having a capacity equal to a corresponding XDR value of the channel.

10. The method of claim 1, further comprising repeating the generating, determining, and updating steps for a second XDR value.

11. A system comprising:
a memory storing instructions; and
a processor, coupled with the memory and to execute the instructions, the instructions when executed cause the processor to:
generate a channel configuration between a first signal pin of a first IC die and a second signal pin of a second IC die based on a multiplex data rate (XDR) of the first signal pin and the second signal pin, wherein the channel configuration includes an association of the XDR to a channel,
determine a signal pin channel assignment based on the channel configuration,
update the channel configuration based on the signal pin channel assignment and a wirelength representative of a total distance between the first signal pin, the second signal pin, and physical ports of the channel, and
perform socket instantiation based on the updated channel configuration and the signal pin channel assignment.

12. The system of claim 11, wherein the processor is further configured to:
acquire a design under test (DUT) data, wherein the DUT data includes the first signal pin and the second signal pin locations and the XDR associated with each of the first signal pin and the second signal pin.

13. The system of claim 11, wherein the processor is further configured to:
repeat the determining and updating steps until an iteration termination condition is satisfied.

14. The system of claim 13, wherein the processor is further configured to:
determine whether under the channel configuration the wirelength is minimal and wherein the predetermined iteration termination condition is satisfied when the wirelength is minimal.

15. The system of claim 11, wherein the processor is further configured to:
determine a first distance from the first signal pin to a first physical port of the channel in the first IC die;
determine a second distance from the second signal pin to a second physical port of the channel in the second IC die; and
wherein the total distance is a function of the first distance and the second distance.

16. The system of claim 11, wherein updating the channel configuration comprises:
determine the wirelength for a group of signal pins, wherein the group of signal pins includes one or more signal pins connected to the same channel.

17. The system of claim 16, wherein the processor is further configured to:
assign a signal pin of the group of signal pins to the channel and assign another signal pin of the group of signal pins to another channel.

18. The system of claim 11, wherein the processor is further configured to:
create a graph representative of the first signal pin of the first IC die and channels between the first IC die and the second IC die; and
assign the first signal pin to the channel when there is a flow in the graph between the first signal pin and the channel.

19. The system of claim 18, wherein the processor is further configured to:
create a signal node for the first signal pin;
create a channel node for each channel of channels between the first IC die and the second IC die;
create a first edge between the signal node and the channel node, the first edge having a weight equal to a distance representative of a total distance between the first signal pin and the second signal pin;
create a start node and an end node;
create a second edge between the start node and the signal node; and
create a third edge between the channel node and the end node, the third edge having a capacity equal to the XDR value of the channel.

20. A non-transitory computer readable medium comprising stored instructions, which when executed by a processor, cause the processor to:
generate a channel configuration between a first signal pin of a first IC die and a second signal pin of a second IC die based on a multiplex data rate (XDR) of the first signal pin and the second signal pin, wherein the channel configuration includes an association of the XDR to a channel;
determine a signal pin channel assignment based on the channel configuration;
update the channel configuration based on the signal pin channel assignment and a wirelength representative of a total distance between the first signal pin, the second signal pin, and physical ports of the channel; and
perform socket instantiation based on the updated channel configuration and the signal pin channel assignment.

* * * * *